United States Patent [19]

Norman

[11] Patent Number: 5,110,249
[45] Date of Patent: May 5, 1992

[54] TRANSPORT SYSTEM FOR INLINE VACUUM PROCESSING

[75] Inventor: Arthur E. Norman, Northridge, Calif.

[73] Assignee: Innotec Group, Inc., Simi Valley, Calif.

[21] Appl. No.: 393,673

[22] Filed: Aug. 14, 1989

Related U.S. Application Data

[63] Continuation of Ser. No. 922,172, Oct. 23, 1986, abandoned.

[51] Int. Cl.⁵ .............................................. C23C 14/34
[52] U.S. Cl. .................................. 414/217; 414/331; 414/222; 414/750; 204/298.25; 118/719; 118/500; 104/135
[58] Field of Search ............... 414/217, 331, 222, 749, 414/750, 911, 684; 204/298.23, 298.25, 298.26, 298.27; 118/50, 50.1, 719, 729, 730, 500, 503; 104/135

[56] References Cited

U.S. PATENT DOCUMENTS

| | | | |
|---|---|---|---|
| 3,294,670 | 12/1966 | Charschan et al. | 414/217 X |
| 3,521,765 | 7/1970 | Kauffman et al. | 414/217 |
| 3,584,847 | 6/1971 | Hammond, Jr. et al. | 118/719 X |
| 3,973,665 | 8/1976 | Giammanco | 414/217 X |
| 4,042,128 | 8/1977 | Shrader | 104/135 X |
| 4,498,416 | 2/1985 | Bouchaib | 204/298.25 X |
| 4,500,407 | 2/1985 | Boys et al. | 414/217 X |
| 4,749,465 | 6/1988 | Flint et al. | 414/217 X |
| 4,764,076 | 8/1988 | Layman et al. | 414/217 |
| 4,790,921 | 12/1988 | Bloomquist et al. | 414/217 X |

Primary Examiner—Frank E. Werner
Attorney, Agent, or Firm—Ellsworth R. Roston; Charles H. Schwartz

[57] ABSTRACT

An inline processing system for processing a batch of pallets, including a first magazine for supporting a predetermined number of unprocessed pallets. A load chamber for receiving and supporting the first magazine and for indexing the magazine to present individual ones of the unprocessed pallets to a transport position. One or more process chambers located inline with the load chamber and with each process chamber including a pair of valves at opposite ends of each process chamber to control the passage of individual ones of the pallets between each process chamber and the adjacent chamber. A second magazine for supporting the predetermined number of pallets after processing. An unload chamber for receiving and supporting the second magazine and for indexing the magazine to receive individual ones of the processed pallets from a transport position. A plurality of carriers equal in number to the number of chambers less one for location within the chambers for receiving individual ones of the pallets from the first magazine and for supporting the individual ones of the pallets for transport between the chambers to the second magazine. A drive and support structure located within each chamber for coupling to the carrier to support the carrier to drive the carrier from each chamber to an adjacent chamber.

40 Claims, 13 Drawing Sheets

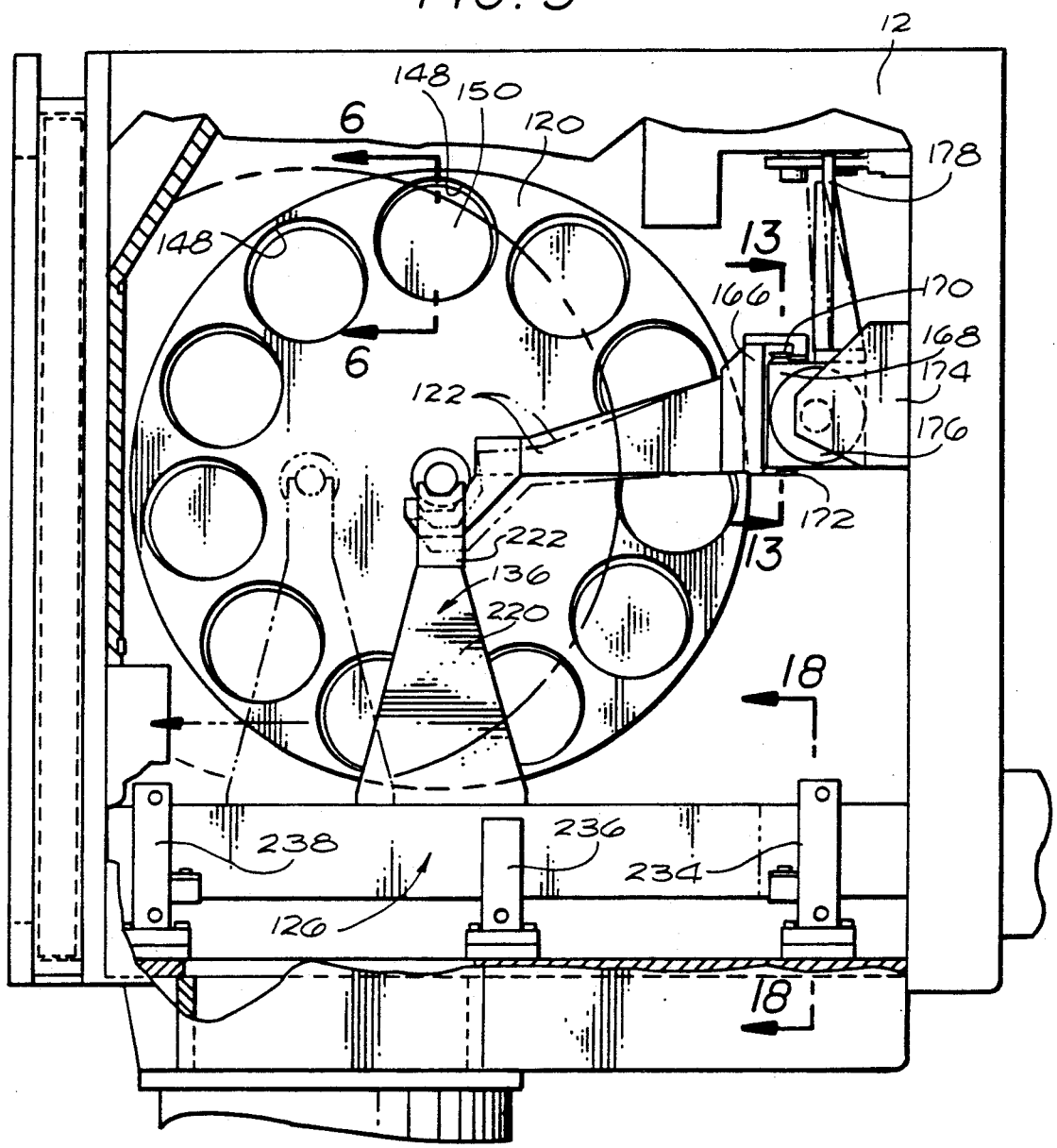
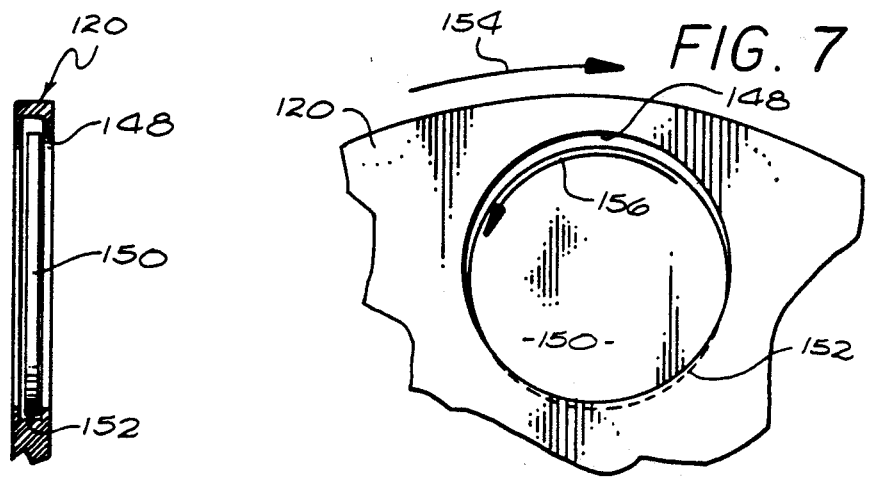
FIG. 5
FIG. 6
FIG. 7

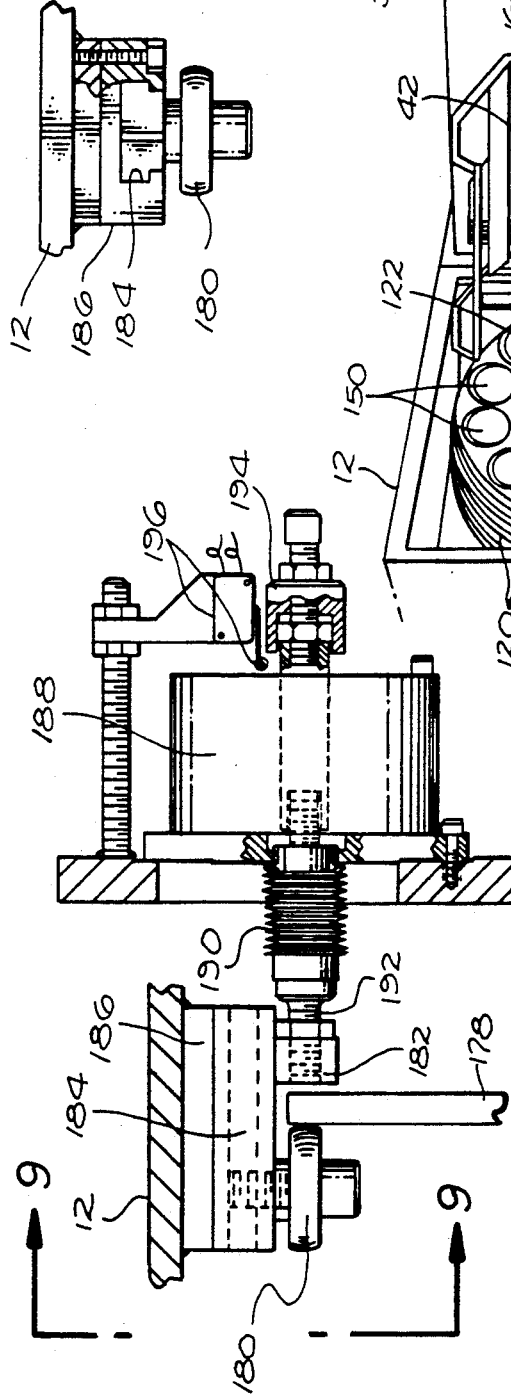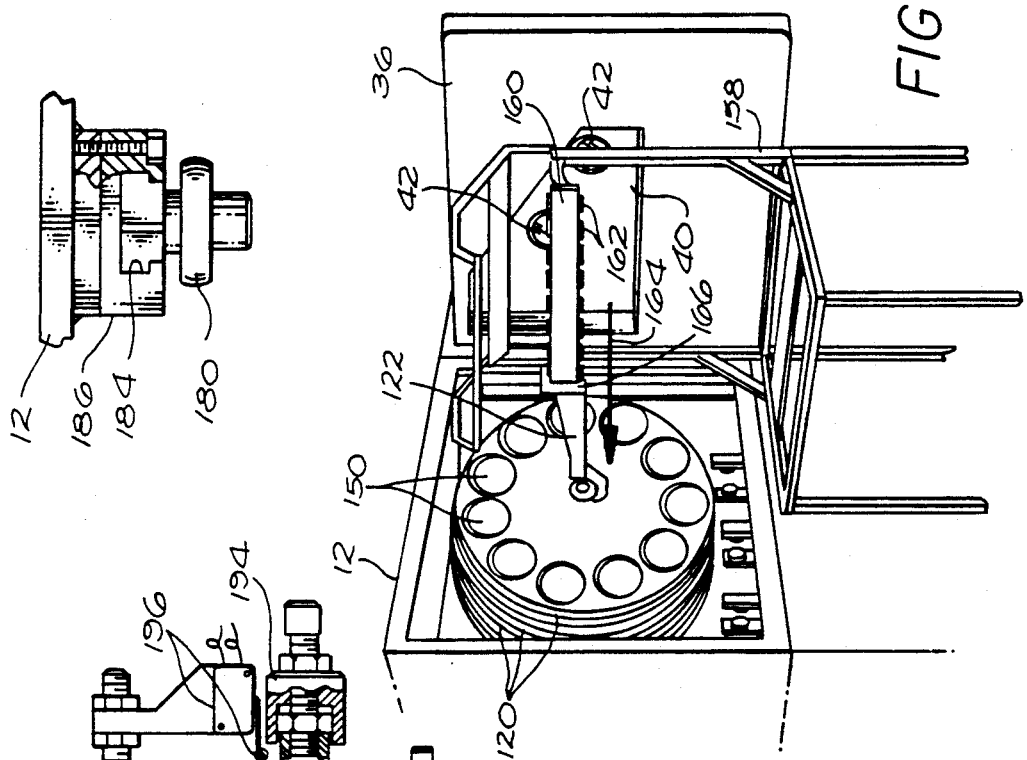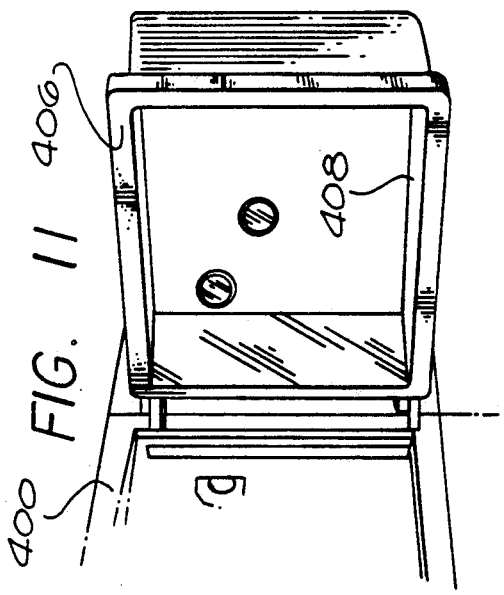

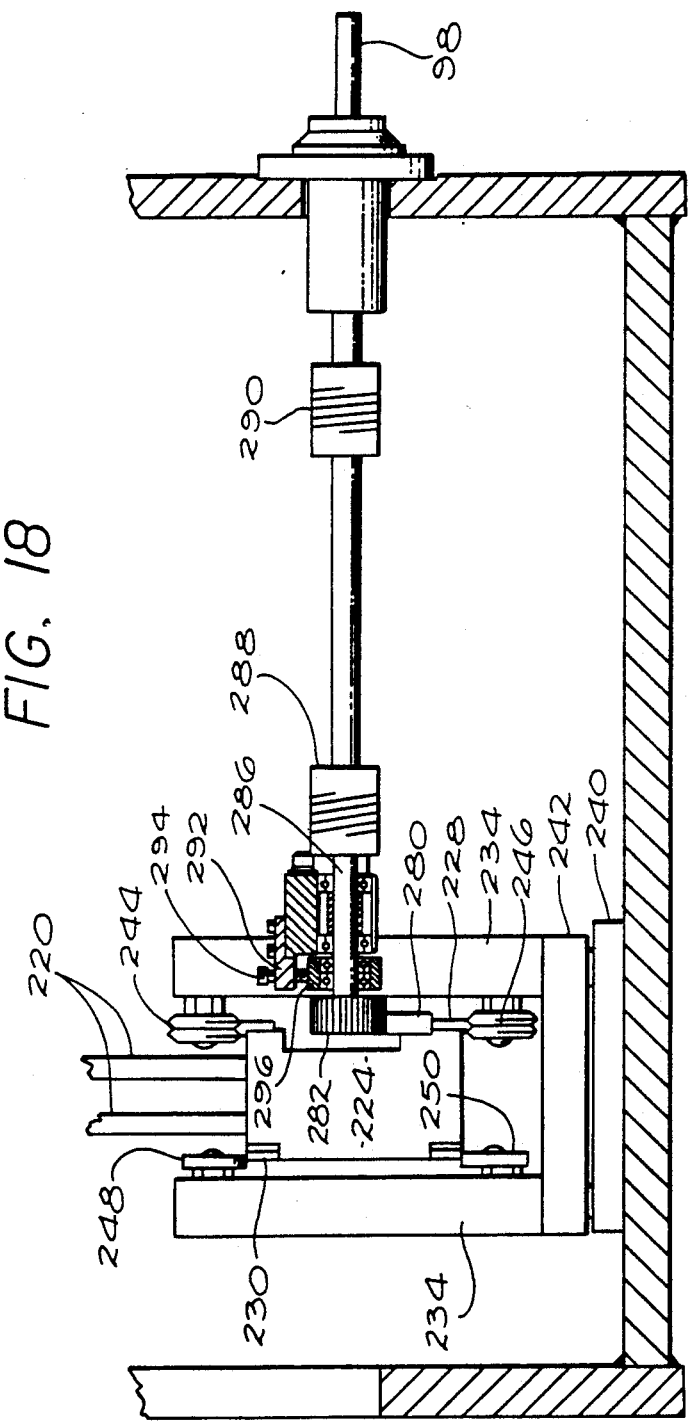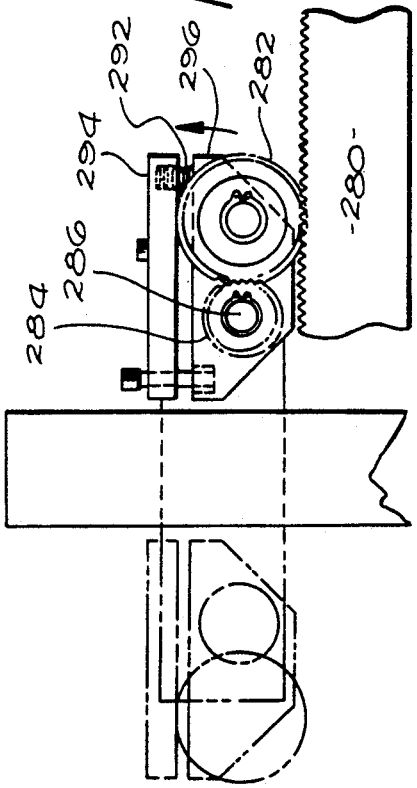

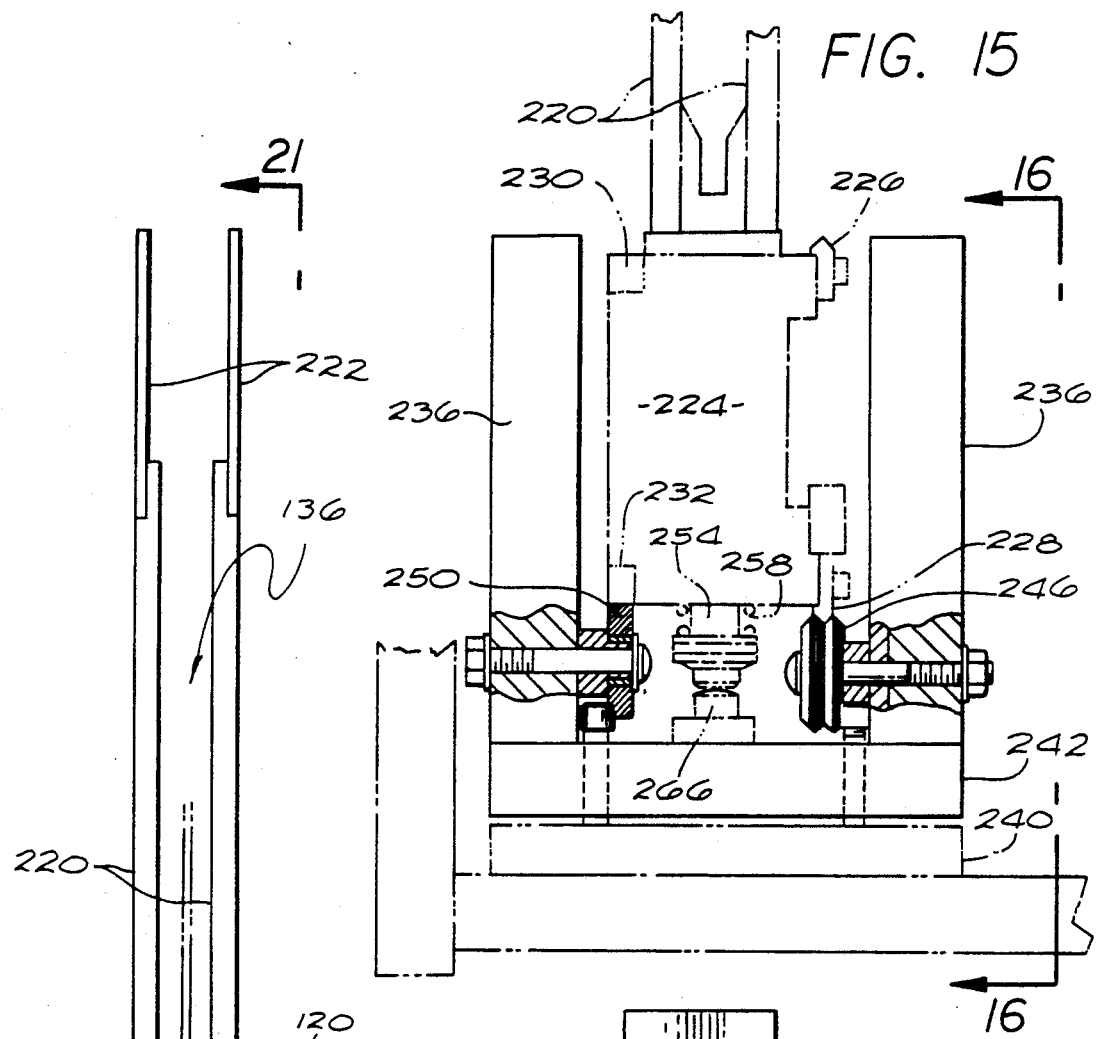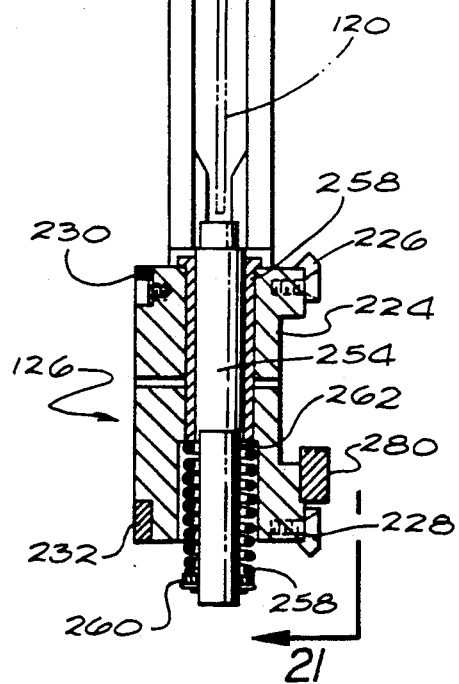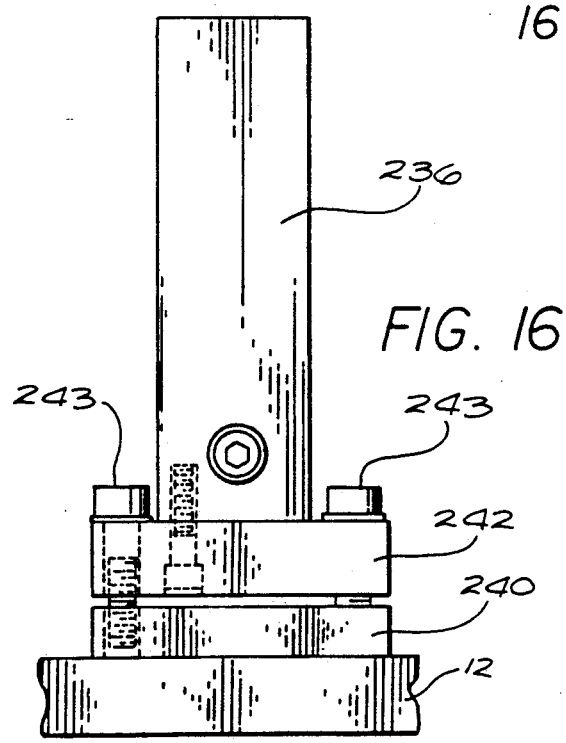

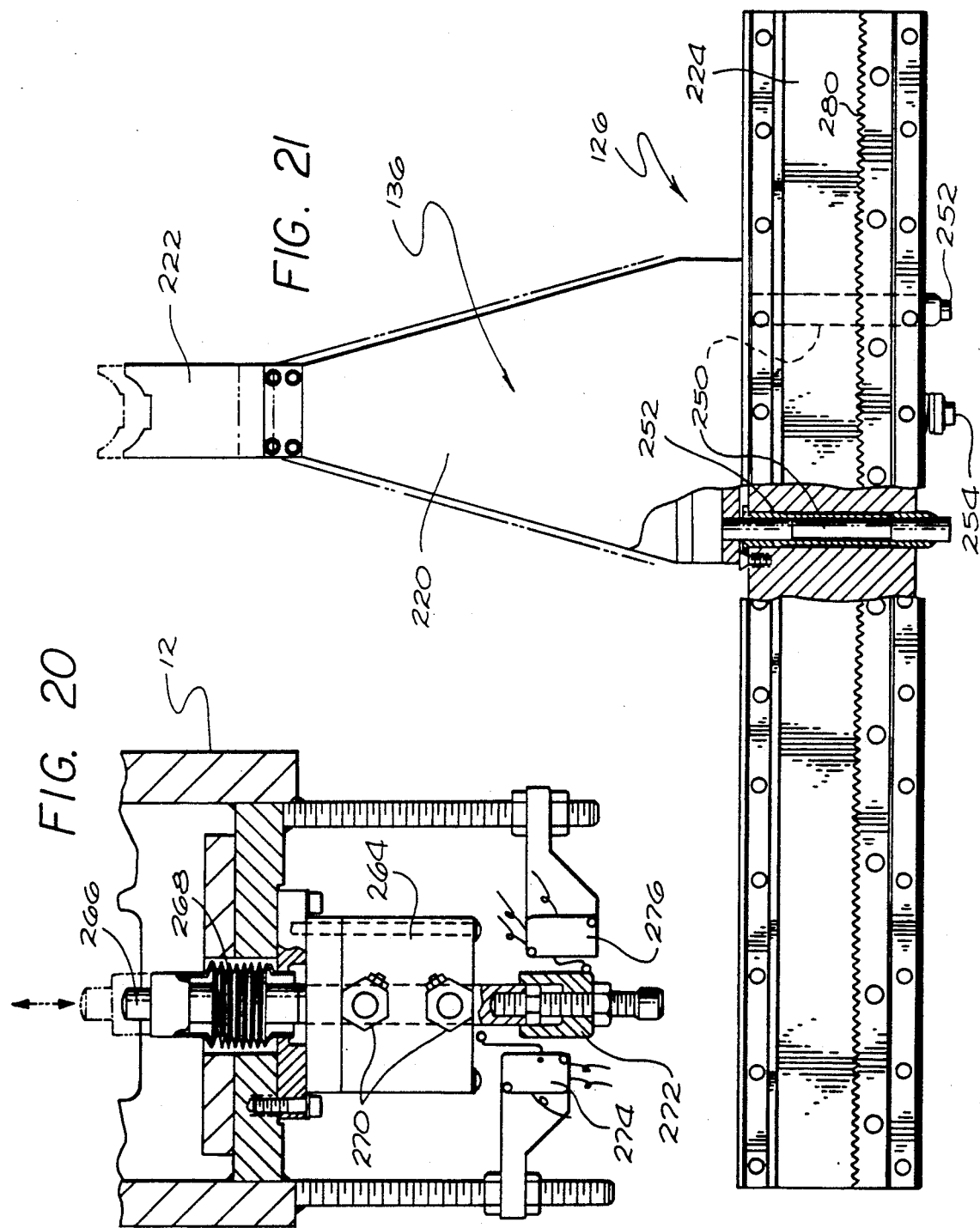

TRANSPORT SYSTEM FOR INLINE VACUUM PROCESSING

This is a continuation of application Ser. No. 922,172 filed Oct. 23, 1986, now abandoned.

BACKGROUND OF THE INVENTION

1. Field of the Invention

The present invention relates to an in line processing system such as inline vacuum processing system for processing groups of substrates. Specifically the invention relates to a transport system for transporting the substrates between a plurality of independent isolated chambers so as to provide for the inline processing of the substrates in each chamber as the substrates are transported between the independent chambers. After the transport of the substrates to the chambers, each chamber may be operated independently to process the substrates so as to provide for a substantially continuous feedthrough of the substrates from a first chamber to an end chamber. The invention may also be operated on a batch rather than continuous basis.

2. Description of the Prior Art

In general, prior art processing systems operate on a single group of substrate material and with the processing of the single group of substrate material completed before a new group of substrate material is processed. This, for example, may be accomplished in a number of ways. In a first technique, substrate material may be loaded into a large processing chamber, such as a vacuum chamber, which has a plurality of separate stations within the same chamber. Once the substrate material has been loaded into the first station position, the chamber is evacuated and the substrate material is moved from station to station within the evacuated chamber to complete the processing.

When the processing is complete the vacuum is released and the chamber may be opened to remove the processed substrate material. A new group of substrate material may then be loaded for processing. The above described prior art system does not allow for isolation between the various process stations within the chamber. In addition, the chamber must be opened and closed each time it is necessary to unload the processed substrate material and load unprocessed substrate material so that the system cannot provide for a continuous operation and thereby speed up the processing.

Another type of prior art system does include a number of inline chambers each isolated from the other and with the substrate material to be processed loaded into a first chamber and with the substrate material then transported from the first chamber through subsequent chambers for processing within each chamber. Typically, once the processing has been completed in the last chamber, the substrate material is then brought back through all of the intermediate chambers to be unloaded. The transport mechanism between the individual chambers is a single transport mechanism and only a single group of substrate material may be processed at one time. This type of prior system operates only on a single group of substrate material, even though the substrate material is processed in separate chambers. Again, this type of processing system is relatively slow because only single group of substrate material may be processed in each complete cycle of the processing system.

In addition to the above deficiencies, the prior art systems described above can allow for contamination of the processed material during processing. This is due to the necessity of opening and closing the chamber for each single group of substrate material that is being processed. Although the second type of system is an inline system and does have isolation between individual chambers, still after the processing of each single group of substrate material, the system must be opened to the atmosphere.

The prior art processing systems, therefore, are relatively slow in operation and do not allow for a continuous throughput of the processing of groups of substrates or even the processing of batches of groups of substrates. Additionally, individual groups may become contaminated because of the constant need to expose the chambers to atmospheric conditions during the loading and unloading of each group of substrates. It is, therefore, desirable to overcome the deficiencies of the prior art systems and provide for a more continuous operation of the processing system to allow for a substantially continuous flow or at least a processing of batches of groups of substrates. In this way, a more efficient operation can be achieved and with a lesser exposure to possible contamination caused by the constant opening and closing of the prior art systems during loading and unloading.

SUMMARY OF THE PRESENT INVENTION

The present invention provides for an inline processing system including a unique transport mechanism and magazine structure to allow the simultaneous processing of individual groups of substrate material. As an example, the system may provide for a sputter deposition which can sputter deposit either one or both sides of individual substrates at the same time. The system of the present invention is also directed to a processing system where multiple processes are required and where the individual processes must be isolated from each other. As an example, the system of the present invention may include a number of individual chambers, such as a load chamber, one or more intermediate process chambers and an unload chamber. All of the chambers are separate from each other and are isolated from adjacent chambers and with all of the chambers providing for a total process wherein the steps in the process are provided in chambers which are separate and isolated from an adjacent chamber. All of the chambers may be cryopumped to produce a high vacuum in each chamber independent of an adjacent chamber.

In order to provide processing of a plurality of groups of substrates at the same time, a group of the substrates are supported on an individual pallet. A plurality, or batch of such pallets, each supporting a group of substrates, may in turn be loaded into a magazine supported in the load chamber. During the processing, each pallet is progressed through the individual chambers from one chamber to the other and with the separate processing occurring in the individual chambers after each transport step. Since each chamber is independent, multiple processes may occur at the same time on individual pallets. When each of the pallets is processed, it is moved into the unload chamber, also supporting a magazine structure, so that the entire plurality or batch of pallets may be unloaded at the same time. A new magazine of pallets may have been previously loaded into the load chamber so that a nearly continuous operation can be achieved to increase the throughput greatly when compared with prior art systems.

In order to provide for the transport of the individual pallets between chambers, individual carriers are provided for every chamber, except one. In this way a plurality of pallets may be moved at the same time from one chamber to the next without having to use the same transport mechanism for the movement of multiple pallets.

As each pallet is deposited in a process chamber, the system of the present invention includes a means for rotating the individual pallet and thereby rotating the substrates to produce a uniform, sputter deposition of the appropriate materials to the substrates. The system of the present invention may use conventional planar magnetron or RF diode target assemblies, power supplies and/or matching networks where necessary. In addition, the system may provide for RF sputter etch and with substrate heating if necessary. The actual process and material handling and the vacuum pumping parameters may be controlled through a dedicated programmable controller with sufficient memory capacity to handle multiple processes.

The actual pumping equipment used to provide for the vacuum in the chambers is designed to allow for the shortest possible cycle time and the highest throughput. This in combination with the nearly continuous operation of the system, except for the short loading and unloading cycle time to load and unload entire magazines, insures for the maximum efficiency and flow through of pallets in the system.

The system of the present invention is designed so that an infinite variety of processing may be provided using a plurality of individual chambers or groups of chambers. For example, each chamber may be completely separate, but it has been found that a more efficient construction of a system may be accomplished by the use of a number of standard system modules. These may be as follows:

A first module may be a two chamber module consisting of a load chamber and a process chamber together with a passageway including a slit valve separating the two chambers. A second module is an unload chamber and a process chamber with a passageway including a slit valve isolating the two and another passageway including a slit valve for isolating the process chamber from whatever it is connected to. It can be seen that a combination of the first and second modules, therefore, would provide for a four chamber structure with a load chamber and an unload chamber and with two process chambers in between and with each chamber isolated from the next by a passageway including a slit valve.

A third module may consist of a process chamber and a passageway including a slit valve and any number of these third modules may be positioned intermediate the first and second modules to construct a system having infinite length and infinite variety of processing. A fourth module may be a process chamber only and this module may be used to form a variant of the system of the present invention wherein a single chamber may be used for both loading and unloading and with this fourth module thereby providing an end chamber for the processing of a batch of pallets using the structure of the present invention.

In addition to the actual process modules, a control console may also be provided to control the operation of the movements of the pallets and additionally the actual processing which occurs in a process chamber. A minimum system would be a first module and a control console. Such a system would allow for a batch of pallets to be loaded in the magazine in the load chamber and then moved to the process chamber for processing. Each pallet after processing would then be returned to the magazine and with a new pallet then moved for transport to the process chamber for processing. This would occur until all of the batch of pallets in the magazine would be processed. This type of system provides for the continuous processing of all of the batch of pallets in the magazine until they are all processed. This eliminates the necessity of loading and unloading individual pallets for processing and would increase the efficiency of the system.

It may be appreciated that any number of modules can be attached together and the control console can be designed and expanded if necessary to handle up to any number of such process chambers. As described above, if both a first and second module are used, then both load and unload chambers may be provided so that multiple processes can be occurring at the same time and with these multiple processes taking place on multiple number of pallets equal to the number of process chambers. In order to insure that each process is separate, each module is equipped with its own pumping system, except for a common roughing system to rapidly bring the entire processing system to a common state before the individual pumping systems are operated.

In addition, each chamber has its own electronic controls, including vacuum gauging and programmable control components so that each module may be controlled separately from the control console. In addition, each module has its own utility connections and manifolds. This independent module concept allows the system to be disassembled into multiple sections so that they can be transported easily from the place of manufacture to where the system is to be used. In addition, the independent module concept allows for the system to be expanded or contracted by adding additional modules or subtracting modules when desired.

Both the load and unload chambers are fitted with a pallet magazine structure that can hold a plurality or batch of substrate pallets such as 10 in a single magazine. The individual pallets are supported in the magazine by individual swinging magazine arms. Specifically an actuating mechanism can swing each magazine arm a few degrees to either raise the pallet from or lower the pallet onto a pallet carrier. The entire batch of pallets forming the magazine is mounted o a ball screw so that individual pallets may be indexed to a transport position for lowering onto the pallet carrier. The carrier means is designed to carry a single pallet between the load chamber and the first process chamber and then return.

A plurality of such carrier means are positioned to move individual pallets between the chambers so that each pallet can progress through the system from chamber to chamber and with the multiple carrier means potentially moving the same multiple number of pallets. Since the individual carrier means move between adjacent chambers, there is one less carrier than the number of chambers. As each individual pallet progresses through the individual chambers, it ultimately deposited into an unload chamber similar to the load chamber but a mirror image thereof, and which also contains a magazine essentially the same but a mirror image of the magazine in the load chamber. As each individual pallet is processed, it is deposited into the magazine structure in the unload chamber and the magazine structure is then indexed to received the next processed pallet.

In this way, all of the pallets in the magazine structure in the load chamber are processed through the system from the load to the unload chamber to allow for a nearly continuous processing of the plurality or batch of pallets and with multiple processes being accomplished on multiple pallets at the same time. If the integrity of the seals between the individual chambers is maintained, then it is possible to load a new magazine structure into the load chamber after the last pallet has been transported from the load chamber to the first process chamber and with this new magazine loaded into the load chamber while processing is occurring. Similarly the unload chamber may be unloaded while processing is occurring and, in this way, a substantially continuous operation of the system occurs.

As noted above, it is also possible to use a single chamber for both loading and unloading and with the plurality or batch of pallets in the magazine processed before it is necessary to unload and reload the single load/unload chamber. Also, in this type of system and if different pallets in the magazine are to have different processing, then it would be possible to control individual pallets to be transported to specific chambers and with multiple processes occurring even with a single load/unload chamber. The system of the present invention allows for an infinite variety of processing in accordance with the numbers and types of modules used and with the processing occurring on a magazine basis including the plurality or batch of pallets to achieve a much higher throughput and efficiency in the processing system.

The actual drive for the carrier means is provided separately in each process chamber. In this way the carrier may be independently driven from one chamber to another. The drive for the carrier means may be provided by a pinion which engages a rack forming part of the carrier. The proper positioning of the carrier is produced by position indicators, such as optical devices, to sense and control the position of the carrier. Each process system of the present invention typically includes one less carrier than the number of chambers and each carrier normally has a home location which is at the center of a process chamber. The movement of each carrier is, therefore, from its home location in one process chamber to the home position in the next chamber.

All of the carrier means move simultaneously to both move pallets from chamber to chamber and from load chamber to the first process chamber and from the last process chamber to the unload chamber. When each pallet is moved to or between process chambers, upstanding carrier arms forming a lifting device are used to lift the pallet to a position where it can be engaged by a spindle drive mounted within the chamber. The spindle drive may be inserted into the center of a hub of the pallet. Once the pallet is supported by the spindle drive, the lifting device is retracted so that the carrier is no longer in contact with the pallet. The spindle drive then rotates the pallet during processing to thereby rotate the individual substrates and provide for uniform deposition in the process chamber.

After each process is completed the lifting device is actuated and the carrier arms move up to engage the pallet and the spindle drive is retracted so that the pallet may now be transported by the carrier means to an adjacent chamber. The entire sequence of operations is under control of the control console to insure that the proper operations are in sequence and that operations which have to be in synchronism are in synchronism.

In order to insure that as a system is assembled the tolerance levels may be maintained within an acceptable level, the carrier drive is fragmented into a number of separate groups. This insures that an overall tolerance is not controlling along an entire length of the inline system, but rather the tolerance between individual chambers will be under the control of the separate portions of the carrier drive. These tolerances between individual chambers will be much smaller than any build-up tolerance along the entire length. In addition, the use of the separate carrier drives between the chambers provides for independence during the load and unload portion so that the magazine may be placed or removed from a chamber independent of the movement of the carriers between the process chambers.

The carrier drive between two adjacent chambers is provided by a pinion drive in the individual chamber, which pinion drives a rack forming part of the carrier means. In order to insure that the transfer of the rack from one pinion to the other does not require perfect synchronism and perfect tolerances, the pinion may be spring loaded to float and thereby form a clutch so that the pinion will move out of position and slide until the rack is in the proper position. At that time the pinion will drop in place in the rack. This again insures that the tolerances between the adjacent chambers do not have to be perfect and thereby simplifies manufacturing procedures.

The present invention, therefore, provides for an inline vacuum processing system using a magazine structure for supporting a plurality or batch of pallets in a load chamber, and with each pallet supporting a plurality of substrates, and with the system indexing individual pallets in the magazine to a transport position and transporting them through a plurality of process chambers to an unload chamber, and with multiple processes occurring on individual pallets until all of the pallets in the magazine are transferred from the load to the unload chamber. The invention also includes the use of a single load/unload chamber, and with individual pallets in the magazine being transferred to at least one process chamber, and with all of the plurality or batch of pallets in the magazine being processed and returned to the magazine before a new magazine must be loaded into the system. The present invention, therefore, provides for a more efficient use of the process equipment and thereby a lower cost in the production of the substrates.

BRIEF DESCRIPTION OF THE DRAWINGS

A clearer understanding of the present invention will be had with reference to the following description and drawings wherein.

FIG. 5 illustrates a front view of the load chamber with the door partially broken away to expose a magazine structure supporting a pallet;

FIG. 6 illustrates a side cross-sectional view taken along line 6—6 of FIG. 5;

FIG. 7 is a front detailed view of a single substrate supported in the pallet;

FIG. 8 is a detailed view of an actuator structure for controlling the lifting of a magazine arm.

FIG. 9 is an end view of the structure of FIG. 8 taken along lines 9—9 of FIG. 8;

FIG. 10 illustrates the load chamber positioned with the door open and illustrating a magazine loader and unloader in position immediately after the loading of the magazine;

FIG. 11 is an alternate load or unload chamber wherein the door has been recessed to hold a complete magazine structure and pallets;

FIG. 15 is an end view of a carrier support structure for supporting the carrier means for transporting a pallet;

FIG. 16 is a view of the carrier support structure taken along lines 16—16 of FIG. 15;

FIG. 17 is a detailed view of the portion of the carrier means for raising and lowering the pallet;

FIG. 18 is a view illustrating the driving of the carrier means through a carrier rack and pinion drive;

FIG. 19 is a detail view showing a floating clutch mechanism for insuring that the pinion drive is in proper engagement with the rack;

FIG. 20 is a detail view of an actuator means for raising and lowering carrier arms;

FIG. 21 is a front view of the carrier means taken along lines 21—21 of FIG. 17;

DETAILED DESCRIPTION OF THE PREFERRED EMBODIMENTS

Figure 1:
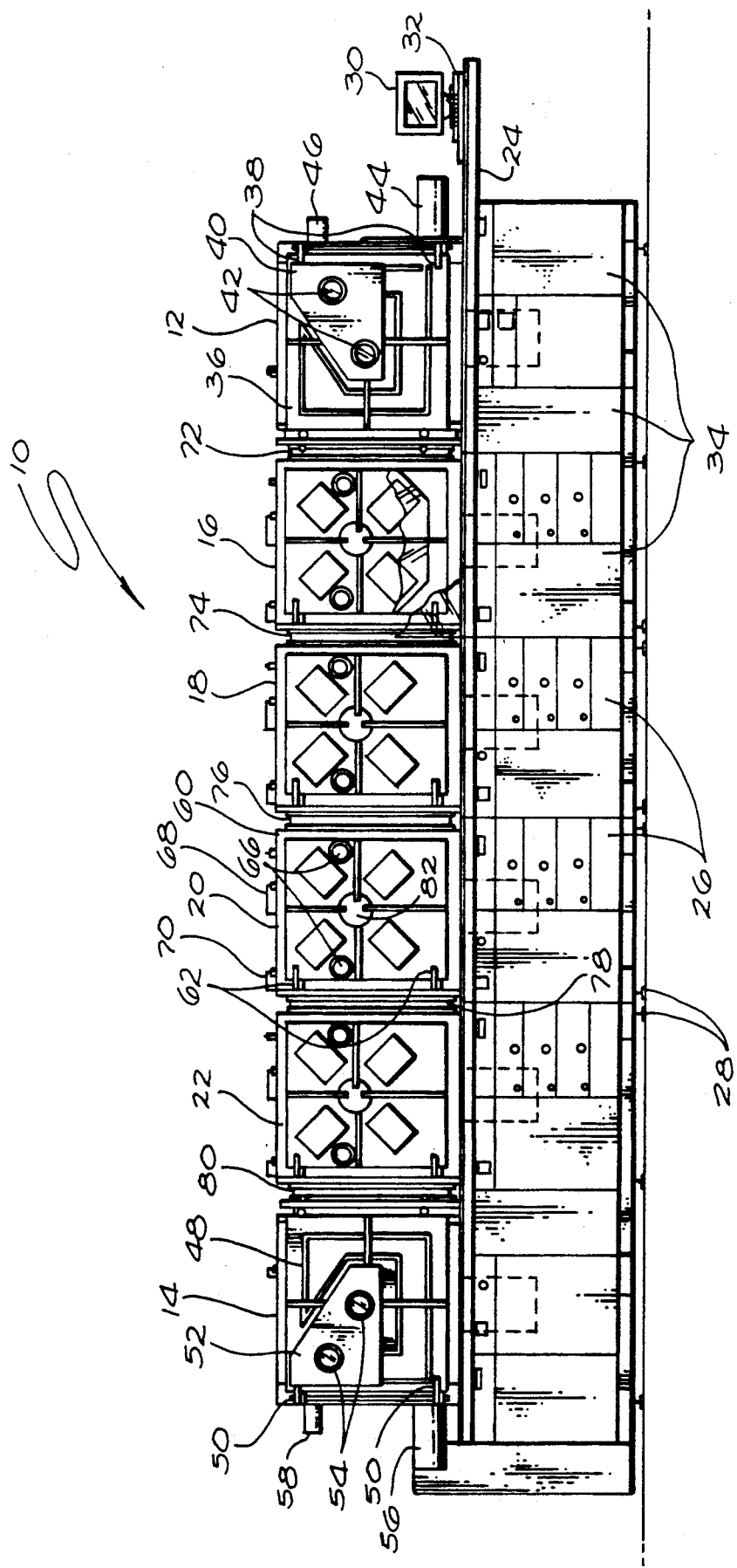
FIG. 1 is a front view of an inline vacuum processing system of the present invention.

A front view of an inline processing system 10 is shown in FIG. 1. The system includes a load chamber 12, an unload chamber 14 and a series of intermediate process chambers 16, 18, 20 and 22. Typically the load chamber 12 and the process chamber 16 form a first module. The unload chamber 14 and process chamber 22 form a second module. Process chambers 18 and 20 form individual third modules.

The various modules forming the inline vacuum processing system may be mounted on a support surface 24. The support surface 24 may be in turn the upper surface of a support structure which includes storage cabinets 26. A plurality of levelers 28 insure that the entire structure is properly leveled. At one end of the support surface 24 is a display unit 30 and keyboard 32 forming a part of a dedicated programmable controller located within cabinets 34. The controller provides for the control of the various processes in the different chambers and provides for the transport of pallets supporting substrates between the different chambers.

The specific details of the programmable controller, which is essentially a micro processor, are well known and form no part of the present invention other than the particular sequence of operations which provide for the inline vacuum processing system of the present invention. In addition, other electronic and electrical components which may be necessary to control and operate the inline processing system of the present processing system of the present invention may be stored within the various cabinet structures 34.

The load chamber 12 includes a door 36 which is mounted to the chamber 12 with hinges 38. The hinges 38 allow the door 36 to be swung outward for complete access to the load chamber. A portion 40 of the door 36 is enlarged and forms an interior space extending outwardly so as to receive a portion of a ball screw actuator which will be described at a later portion of this specification. The ball screw actuator provides indexing of individual pallets in a magazine structure to an appropriate transport position for transport in the pallet between the load chamber 12 and the first process chamber 16.

A pair of observation ports 42 allow visual inspection of the interior of the chamber after the chamber has been cryopumped to a low vacuum within the chamber. Extending from the side of the chamber 12 and inline with the chamber is an extension 44 forming an enclosure for parking a transport carrier means when the door 12 is to be opened for loading. An outer enclosure for an air cylinder 46 also extends from the side of the chamber 12 and with the cylinder 46 used to operate a magazine lifting mechanism within the chamber.

As can be seen in FIG. 1, the unload chamber 14 is substantially identical to the load chamber 12. The unload chamber 14 includes a door 48 mounted on hinges 50 with an enlarged area 52, observation ports 54, a park extension 56 and an air cylinder 58. The unload chamber is substantially the same as the load chamber, but with the two chambers being mirror images of the other.

The various process chambers may be substantially similar and, therefore, the description of the structure of process chamber 20 will be representative of all of the process chambers. Specifically the process chamber 20 includes a door 60 mounted to the chamber by hinges 62. The provision of the door allows for various components mounted on the door to be more easily changed as well as allowing access to the interior of the process chamber for servicing. The door supports a plurality of cathodes 64. The cathodes 64 are used to support material which is to be plated onto substrates supported within the chamber. The material for coating is referred to as the target material and by having the door hinged the targets may be easily changed when depleted. The door also includes observation ports 66 for observing the interior of the chamber during material processing.

At the top of the process chambers additional observation ports 68 may be provided. Also gas inlet valves 70 are shown for all of the chambers including the load and unload chambers. It is to be appreciated that although the invention is being described with reference to the pallets being loaded into the load chamber 12 and the process occurring from right to left, the process may be reversed and the chamber 14 may serve as the load chamber and the chamber 12 may serve as the unload chamber.

Interconnecting each pair of adjacent chambers 12 through 22 is a passageway including a slit valve which allows for the passage of pallets between chambers when the slit value is open. The slit valve also allows for the individual chambers to be completely isolated from each other when the slit valve is closed. Specifically a first passageway 72 including a slit valve interconnects the chamber 12 and the process chamber 16, a second passageway 74 including a slit valve interconnects the process chambers 16 and 18, a third passageway 76 including a slit valve interconnects the process chambers 18 and 20, a fourth passageway 78 including a slit valve interconnects the process chambers 20 and 22 and a fifth passageway 80 including a slit valve interconnects the unload chamber 14 and the process chamber 22.

As described above the structure of the present invention may be conveniently manufactured in module form to have the load chamber 12 and process chamber 16 form a first module with the passageway and slit valve 72 providing isolation between the two chambers. The unload chamber 14 and process chamber 22 form a second module with the passageway and slit valve 80 isolating the two chambers and further including the passageway and slit valve 78 for connection to a further process chamber. If it were not necessary to use additional process chambers, such as process chambers 18 and 20, then the first and second modules may be connected together to form a complete system.

If, however, additional process chambers are desired, then each additional process chamber, such as process chambers 18 and 20 represents a third module. The third module is a process chamber and passageway and slit valve, such as process chamber 18 and passageway and slit valve 74. It may also be desirable to provide for a fourth module which is a process chamber alone without a passageway and slit valve. This structure may be desirable when only half a system is used and with a single chamber used for both loading and unloading. In this example, the fourth module is connected, for example, to a process chamber with a passageway and a slit valve and with the other side blanked off to form an end wall.

Figure 2:
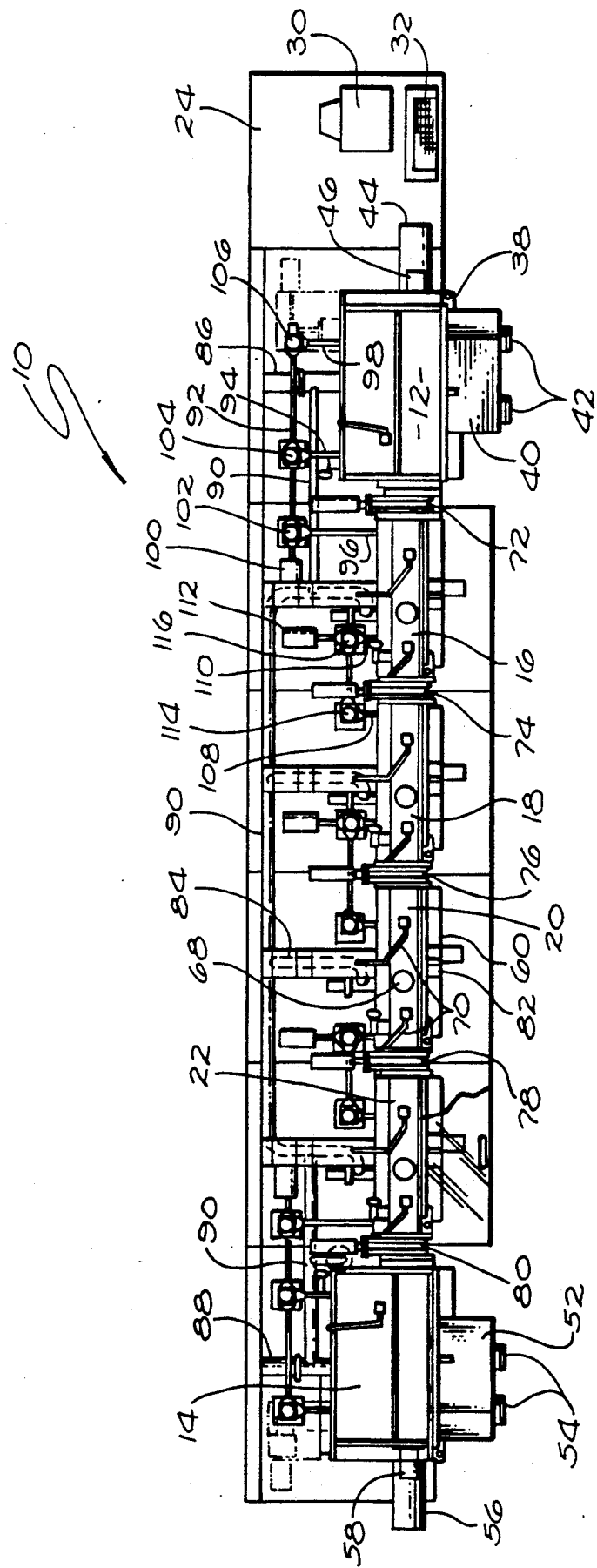
FIG. 2 is a top view of the inline processing system of FIG. 1.
Figure 4:
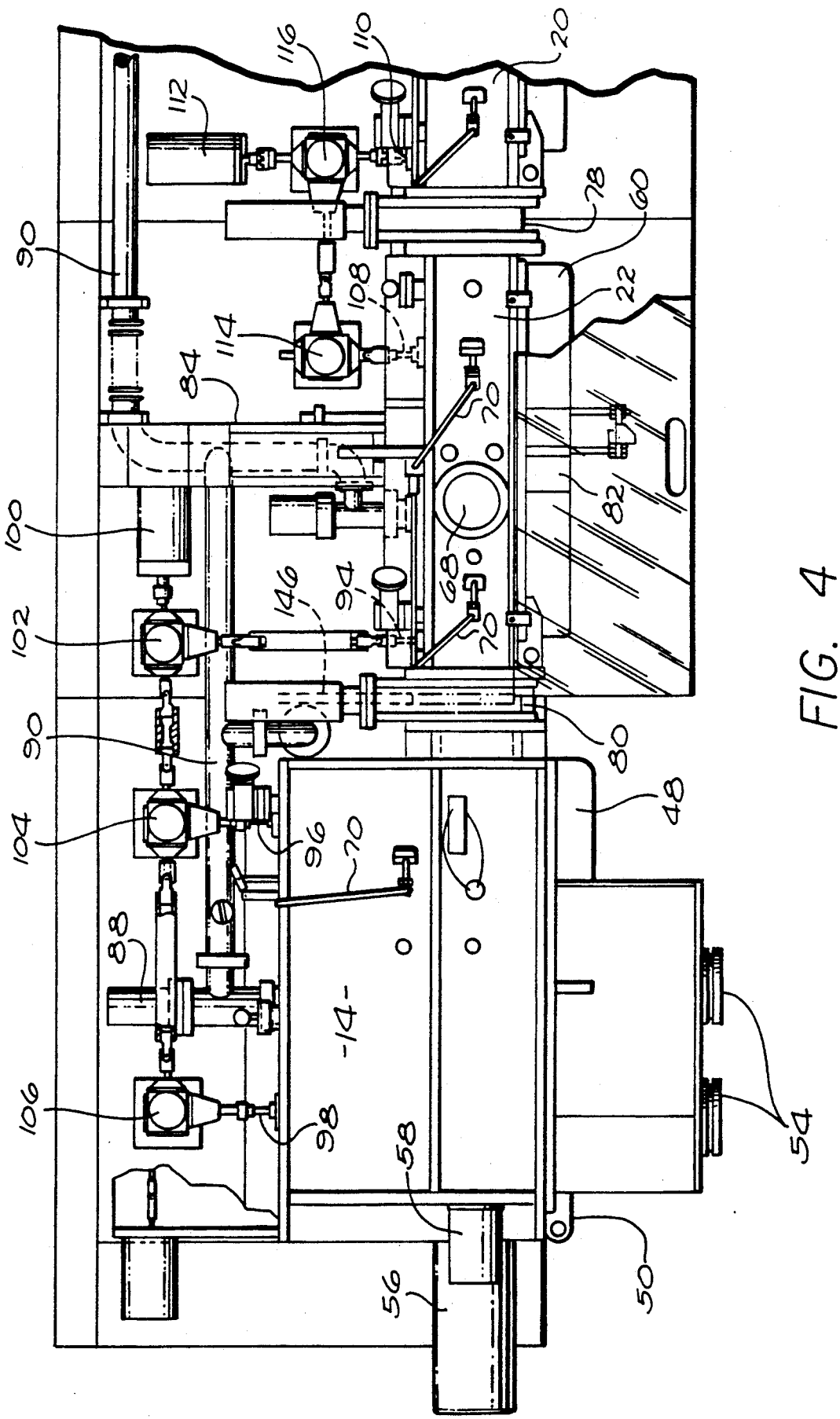
FIG. 4 is a detailed top view of one end portion of the process system of FIG. 1.

FIGS. 2 and 4 illustrates top views of the inline system of the present invention with FIG. 4 being an enlarged view of the unload chamber 14 and the process chamber 22 and additionally including a small portion of the chamber 20. As shown in FIGS. 2 and 4, the individual process chambers include a front extending portion 82 and a back extending portion 84 which form extensions of a front and back spindle assembly which support individual pallets for rotation during processing. Also extending from the rear of the load and unload chambers 12 and 14 are ball screw drive mechanisms 86 and 88.

Other portions of the system which lie to the rear of the inline system of the present invention and extend to the top of the chambers are the various vacuum and gas lines for evacuating the chambers or providing gas to or from the chambers. Specifically a large roughing line 90 extends down the entire length of the process system and is interconnected into each one of the chambers. The roughing line may be used to quickly create a vacuum within all or some of the chambers and may be used when the slit valves are either in an open or closed position so as to pull a similar vacuum throughout the entire system or to provide for a vacuum in an independent chamber. In addition, separate gas lines generally designated as 70 provide for the inlet or outlet of gas to or from any of the individual chambers.

In order to provide for the transport of pallets between individual chambers, a carrier drive mechanism is supported to the rear of the in line system. As described above, the carrier drive is divided into separate groups so as to minimize the effect of any build up of tolerances from one end of the system to the other. Also the use of the separate groups provide for an independence in carrier drive during load and unload so that a magazine can be loaded into or unloaded from the appropriate chambers while processing continues in the process chambers.

A first group 92 of carrier drive members is located between the chambers 12 and 16. Specifically drive shafts 94 and 96 provide for the transport of a carrier between chamber 12 and chamber 16. A drive shaft 98 provides for the parking of the carrier in the park enclosure 44. A motor 100, through appropriate couplers 102, 104 and 106, provides for the drive power to the shafts 94, 96 and 98. A similar structure, not described, is used between the unload chamber 14 and the process chamber 22.

Intermediate each pair of process chambers is a separate group of driving members to provide for transport of a pallet by a carrier means moving between each pair of process chambers. The structure between the pair of process chambers 16 and 18 is described and is representative of all of the pairs of process chambers. The carrier drive structure between chambers 16 and 18 includes shafts 108 and 110 driven by a motor 112 through the use of couplers 114 and 116. The shafts 108 and 110, therefore, provide for the transport of a pallet between the chambers 16 and 18 by a carrier means. The actual description of the structure of the various mechanical portions of the system of the present invention to provide for the transport of a pallet between chambers and to provide for the pickup and release of pallets in the individual chambers including the load and unload chambers and the process chambers, plus the rotation of the pallets in the process chambers will be described in a later portion of this specification. To more clearly understand the general processing of pallets from the load to the unload chambers, FIGS. 3a through 3d illustrate a number of steps in the process so as to define the overall system.

As shown in FIGS. 3a through 3d, pallets 120 are transported from the load chamber 12 to the unload chamber 14 and with the pallets undergoing various processes in process chambers 16 through 22. The load and unload chambers 12 and 14 include magazine arms 122 and 124 which may be rotated between up and down positions. A plurality of such magazine arms are included as part of the magazine structure located in both the load and unload chambers to support a plurality of pallets 120. At the beginning of the process, all of the pallets 120 are loaded onto magazine arms 122 and with the entire magazine structure including the magazine arms and pallets supported in the chamber 12.

The magazine arms 122 and 124 may rotate up and down to allow the individual pallets to be transferred to a carrier means for transport to the process chamber 16 and then on to the other process chambers and the unload chamber 14. Specifically the pallets may be transported to the chambers using carriers 126 through 134. As can be seen, there are six chambers and five carriers. Each carrier may move between adjacent chambers and in addition the end carriers 126 and 134 may be moved into the park enclosures 44 and 56 so that a magazine of pallets may be loaded or unloaded from the chambers 12 and 14 without obstructing the loading and unloading. Each carrier 126 to 134 includes upwardly extending carrier arms 136 through 144. The carrier arms may be raised or lowered in addition to the transport of the pallets between chambers, and the pallets may be released for rotation within a process chamber.

Figure 3A:
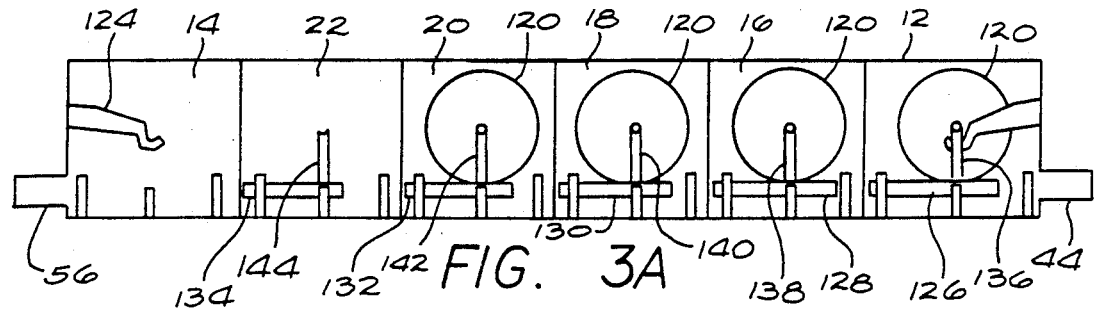
FIG. 3a, 3b, 3c and 3d illustrate in schematic form a number of steps showing the processing of individual pallets from a load chamber to an unload chamber.

As shown in FIG. 3a, a number of the pallets 120 have already been removed from the load chamber 12 and from the magazine arms 122 and have been transported one by one through the chambers to process chamber 20 and with each pallet 120 being processed individually in successive process chambers 16, 18 and 20. The pallet 120 in process chamber 20, therefore, has now undergone three process steps while the pallet 120 in chamber 18 has undergone two process steps while the pallet 120 in chamber 16 has undergone one process step while the pallets 120, remaining in the load chamber 12 are ready to be indexed forward for pickup in turn by carrier arms 136.

As shown in FIG. 3a, a process has just concluded, the rotating spindles have been removed and the system is now getting ready to move all of the pallets in chambers 16, 18 and 20 to the next adjacent chamber and to move a pallet from the load chamber 12 into the first process chamber 16. The carrier arms 136 through 144 are in their raised positions and are engaging the pallets and the magazine arms 122 have been rotated downward so that the most forward indexed pallet 120 in the magazine is now being supported by the carrier arms 136. As indicated above, the spindle assemblies (not shown in FIGS. 3a through 3d) have been disengaged to allow for the transport of the pallets. Before transport, the carrier arms 136 through 144 are lowered.

Figure 3B:
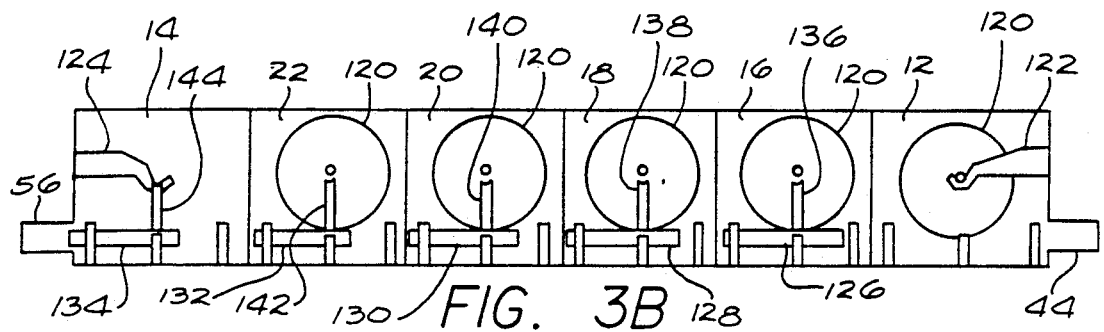

As shown in FIG. 3b, the carriers 126 through 132 have now transported all of the pallets 120 one further chamber so that all of the process chambers 16 through 22 now have a pallet 120. The magazine arms 122 has been rotated upward and the carrier arms 136 through 144 have been raised and then lowered after the spindle assemblies (not shown) have engaged the pallets 120. The pallets in the process chambers 16 through 22 are now supported by the spindle assemblies and the carrier means 126 through 134 supporting the carrier arms 136 through 144 are now free to return to their home positions.

Figure 3C:
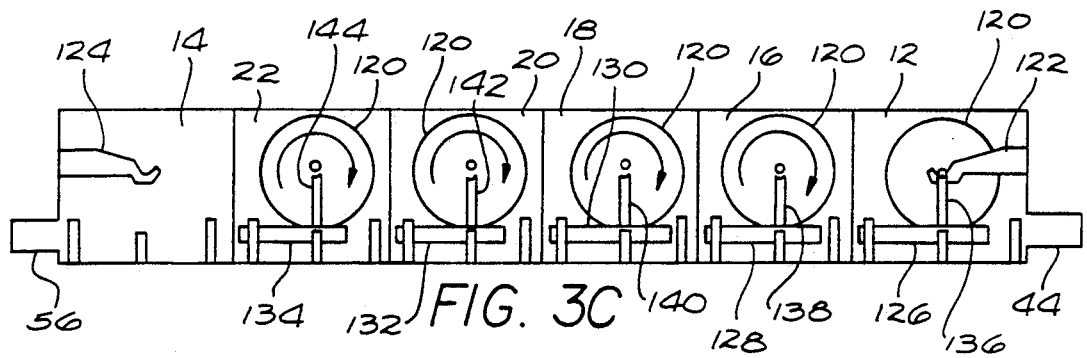

As shown in FIG. 3c the carriers 126 through 134 are now moved to the right to their home positions and the carrier arms 136 through 144 remain in the lower position. At this time the spindle assemblies (not shown) may rotate the various pallets (as shown by arrows) in the chambers 16 through 22 during the processing of the pallets 120. After processing, the rotation is stopped and the carriage arms 136 through 144 are raised to pick up the pallets as shown in FIG. 3a and the magazine arms 122 and 124 are rotated downward. The spindle assemblies are disengaged to allow transport.

Figure 3D:
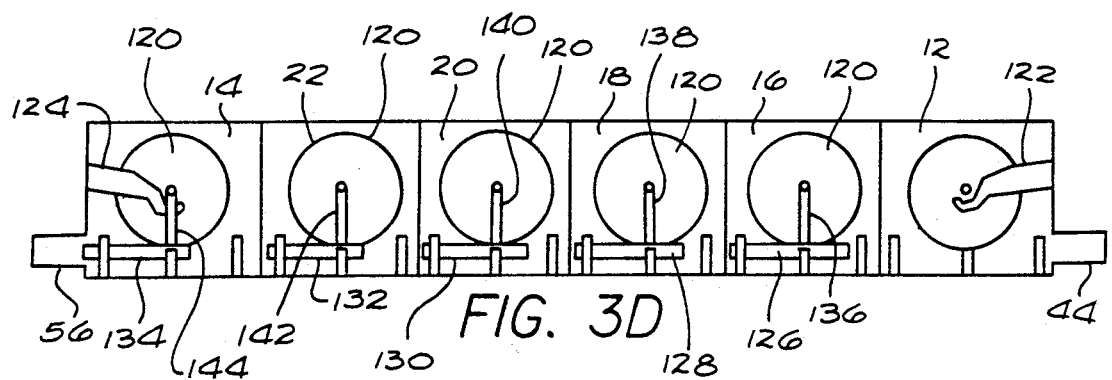

The next step is to transport the pallets one chamber to the left so that now all of the chambers including the unload chamber now include a pallet and with one more pallet taken from the load chamber 12. The step of FIG. 3d is essentially an intermediate step between FIGS. 3a and 3b and shows the carrier arms 136 through 144 in an up position and with the magazine arms 122 and 124 in the down position. The next step would be to engage the spindles, rotate up the magazine arms 122 and 124 (as shown in FIG. 3b), drop the carrier arms and then move the carriers back to the home position (as shown in FIG. 3c).

The entire sequence then continues until all of the pallets 120 stored in the load chamber 12 are removed and sequenced through the various processing chambers until they end up fully processed and stored in the unload chamber 14. The entire sequencing and processing of the plurality of pallets occurs without having to open and close either of the load or unload chambers until the entire batch of pallets have been either picked up from the load chamber or deposited into the unload chamber. At this time, and while the processing is still continuing in the process chamber, full magazines may be loaded or unloaded from the load and unload chambers.

During each processing step, the slit valve between the adjacent chambers is closed to isolate the chambers from each other during processing. The slit valves are open at the appropriate times to allow for transport of the pallets between the adjacent chambers. An individual slit valve incorporated in a passageway is shown in FIG. 4 and specifically the passageway 80, which is representative of all the passageway incorporating a slit valve, is shown to include a sliding member 146 in dotted line which sliding member forms the actuating portion of the slit valve. The sliding member 146 may be opened to provide for communication between adjacent chambers, or may be closed with appropriate gasket seals so that the chambers are isolated from each other.

As shown in FIG. 5, which illustrates the chamber 12 with the door partially broken away, each pallet 120 includes a number of openings 148 to support individual substrates 150. A more detailed view of an individual substrate 150 supported in an opening 148 is shown in FIGS. 6 and 7. Specifically the opening 148 is slightly larger in diameter than the substrate 150 so that the substrate 150 may be received within the opening 148. The opening 148, additionally, includes a groove 152 which extends completely around the opening 148. When the substrate 150 is inserted into the opening 148, the substrate is positioned downward to be supported within the groove 152. As shown in FIG. 7, approximately half of the circumference of the substrate 150 is supported within the groove 152. This insures that the substrate cannot fall out of the openings 148 and the pallet 120 during processing.

During the actual processing, the pallet 120 is rotated in the direction shown by the arrow 154 in FIG. 7. This rotation of the pallet causes the substrate 150 to rotate in the opposite direction as shown in by the arrow 156. The rotation of the pallet throughout the chamber, while the individual substrates are also rotating within the grooves in the openings in the pallet, insures that each substrate receives a uniform sputter deposition during processing since the surface of each substrate is uniformly subjected to various positions within the chamber. Even if there is a non-uniform sputtering of material, the non-uniformity of the sputtering will be averaged out during the course of this double rotation of the substrate and pallet.

As shown in FIG. 10, the magazine supporting the plurality of pallets 120 are initially received in the load and unload chambers, such as the load chamber 12 shown in FIG. 10. The magazine supporting the pallets may be initially stacked for loading and unloading using a magazine loader and unloader 158. This loader and unloader 158 is formed of a framework providing support for the magazine at the proper height. The loader and unloader 158 includes a support arm 160 including a plurality of upper and lower rollers 162 for both supporting and allowing linear motion of the magazine as shown by the arrow 164.

Each pallet is supported by a pair of magazine swing arms 122 and with each magazine arm extending from a U-shaped channel member 166. As shown in FIG. 5, the channel member 166 when slid off of the arm 160 as shown in FIG. 10, may be received by a block 168 and guided by guide rollers 170 and 172. The entire magazine structure is supported by a ball screw actuator 176 which in turn is supported by arms 174 mounted to the wall of the chamber 12. The block 168 is actually mounted for rotation on the ball screw actuator 176 so that the entire magazine structure may be indexed into and out of the enlarged portion 40 of the door 36. This movement allows the individual pallets 120 to be indexed into a transport position for reception by the carrier arm 136.

In order to release the individual pallets for transporting, the magazine arms 122 may be moved up and down as shown by the full line and dotted line positions in FIG. 5. This up and down movement is produced by a plate member 178 which extends upward from the block 168. The plate 178 passes within an actuating structure which in shown in more detail in FIGS. 8 and 9. Specifically, the plate 178 is captured between a roller 180 and a stop 182, both of which are mounted on a slide 184. The slide 184 is supported within a complementary guide block 186 which is in turn mounted to the upper wall of the chamber 12. As the slide 184 moves back and forth, the plate 178 is also moved back and forth which in turn provides for rotation of the magazine arms 122 up and down.

The slide 184 is controlled by an air cylinder 188 which is mounted to extend through the side of the chamber 12. A bellows 190 seals the movement of a rod member 192 which is in turn coupled to the stop 182. The limit of the movement of the rod 192 is under control of a stop member 194. The stop member also controls a switch 196 to insure that the plate 178 is controlled to rotate the proper distances to in turn accurately control the up and down movement of the magazine arms 122.

When the magazine arms 122 are in the upper position, pallets 120 are supported by the magazine arms and cannot be transported out of the chamber 12. If however, the magazine arms 122 are rotated downward, an individual pallet 120 in the proper index position may be transferred to the carrier arms 136, and the carrier 126 can now transport the pallet out of the chamber 12 to the adjacent process chamber 16.

Figure 12:
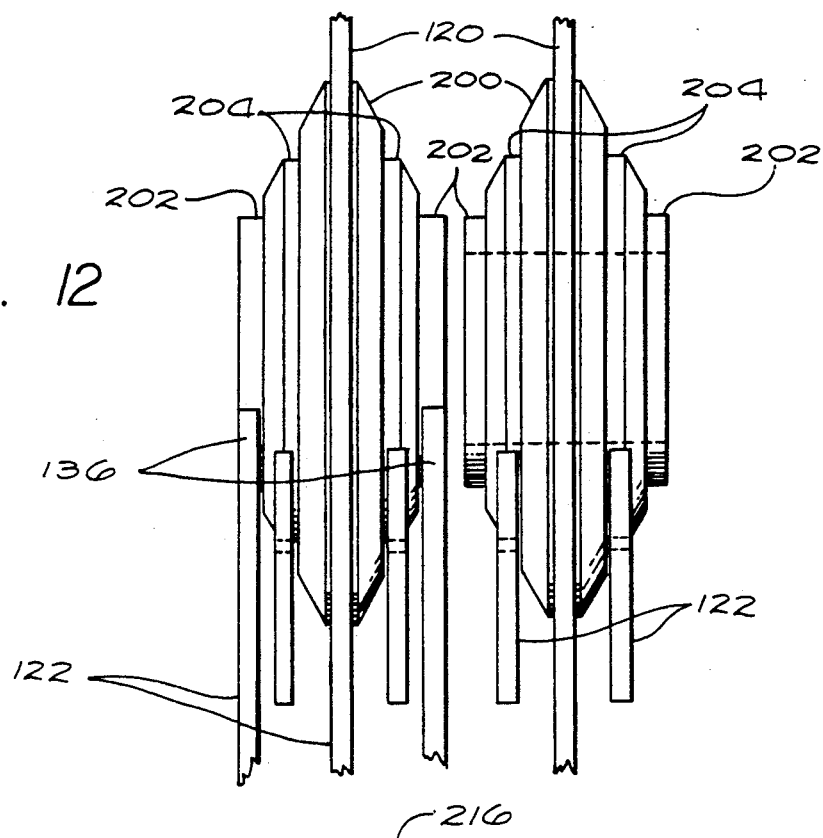
FIG. 12 is an end view of a portion of the magazine illustrating the pallets supported by magazine arms and with one pallet in position for support by carrier arms.
Figure 13:
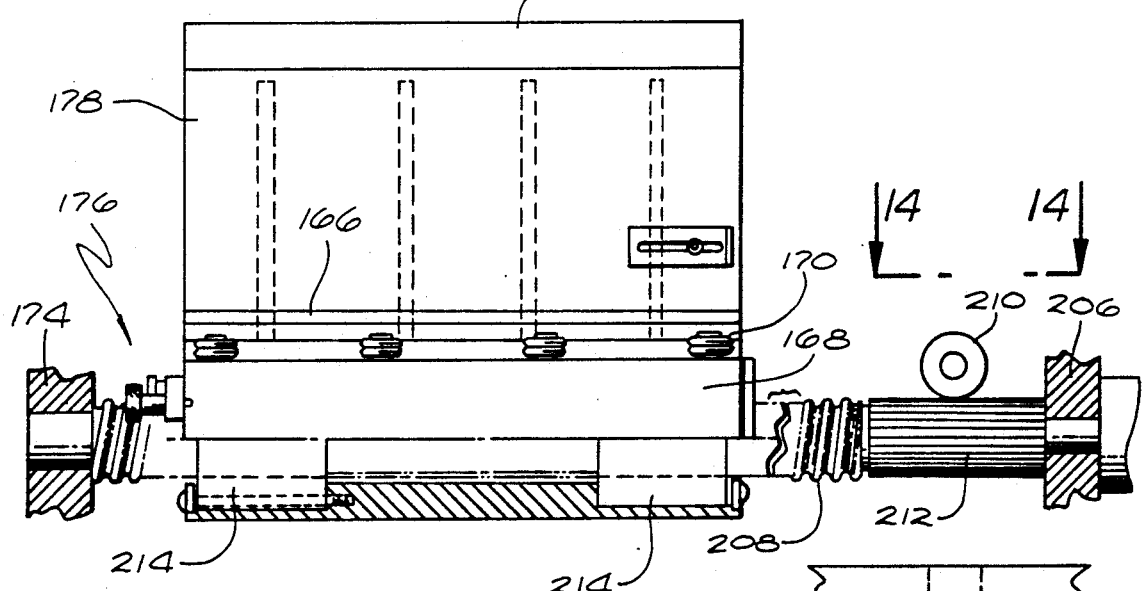
FIG. 13 illustrate a view of a magazine ball screw actuator to provide for indexing of individual pallets to a carrier transport position.
Figure 14:
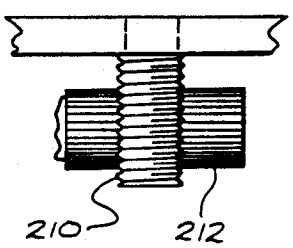
FIG. 14 is a view of a drive for the ball screw actuator taken along lines 14—14 of FIG. 13.

FIGS. 12, 13 and 14 illustrate in more detail the structure of the pallets as supported by magazine arms and the ball screw actuator for indexing the magazine structure to a transport position. As shown in FIG. 12, an individual pallet 120 includes a central stepped hub member 200 which hub member includes first step positions 202 to receive and support the carrier arms 136 and second step portions 204 to receive and support the magazine arms 122. As can be seen in FIG. 12, the left hand pallet 120 is indexed to a position adjacent to the carrier arms 136 and shows both the carrier arm 136 and the magazine arms 122 positioned adjacent to the appropriate step portions. As the magazine arms 122 are moved downward, the left hand pallet 120 is lowered onto the carrier arms 136 and this releases the pallet for transport by the carrier arms 136 to the next chamber.

The pallets to the right of the left hand pallet of FIG. 12 are only supported by the magazine arms 122 and until the magazine is indexed forward to the carrier transport position, then the pallets at the right cannot be transported by the carrier arms 136. The actual indexing of the magazine is accomplished by the ball screw actuator 176 generally indicated in FIG. 5 and as shown in detail in FIGS. 13 and 14. The ends of the ball screw actuator are supported by the retaining arms 174 shown in FIG. 5 and by a second retaining arm 206.

The actuation of the actuator 176 is provided by a ball screw 208 which revolves in accordance with a drive provided by a worm 210 engaging a worm gear 212. The spline is a portion of the ball screw itself. The ball screw 208 drives a pair of ball nuts 214 supported within the block 168. The rotation of the ball screw 208 thereby provides for indexing of the entire magazine structure including the plurality of pallets 120 to various index positions and thereby align individual pallets with the carrier arms 136. Therefore, as each individual pallet is transported out of the load chamber 12, the ball screw indexes the next pallet 120 forward so that this next pallet may be then picked up by the carrier arms 136.

As indicated above, when the magazine arms 122 are in the upward position this maintains the pallets in the upward position. The carrier arms 136 are typically moved only when they are in the downward position, so that the carrier arms can pass under the particular step portions 202. When the magazine arms 122 are rotated downward, then a particular pallet will now be supported by the carrier arms and a further rotation of the magazine arms frees the magazine arms from the step portions 204. When the carrier arms 136 transport the pallet out of the chamber the position of the carrier arms is high enough so that the step portions 204 will pass over the magazine arms 122 in their lowered position. It is to be appreciated that if necessary, the carrier arms 136 can be raised before transport to insure that the magazine arms 122 clear the step portions 204.

The operation at the unload chamber 14 is essentially identical, but in reverse and with the magazine initially empty and the ball screw stepped inward for the arrival of each pallet as each pallet is transported from the process chamber 22 into the unload chamber 14. The entire magazine structure for both the load and unload chambers is rotated between the upper and lower positions using the plate member 176 and in order to insure that the rotation and translation of the magazine is smooth, the guide members 170 and 172 and roller member 180 all are designed to provide for smooth engagement between the moving parts. In addition, an upper surface 216 of the plate 176 is machined to insure the smooth translation as the plate is moved to the various index position for pickup or drop off of the individual pallets.

As seen in FIG. 5 and in more detail in FIGS. 15 through 21, the carrier assembly includes upwardly extending carrier arms 136. A pair of such arms are used with each pallet and each arm is formed by a lower support section 220 and an upper support section 222. The upper support section 222 includes a shaped upper end to receive and support one of the step portions 202 of the hub of the pallet 120. The carrier arms 136 are guided for transport by a carrier block 224 which block includes elongated guides 226 through 232. The guides 226 and 228, having tapered ends, are located on one side of the carrier block 224 in upper and lower positions. On the opposite side of the carrier block 224, guides 230 and 232 are formed as bearing surfaces. The tapered guides and bearing surfaces are used for smoothly transporting the carrier block 224 and the carriage arms 136, when supporting a pallet, between first and second chambers. The same carrier structure is used between all of the chambers in the inline system of the present invention.

The actual carrier assembly is supported for transport between sets of upstanding support arms 234, 236 and 238. The support arms in turn are mounted to the bottom wall of the chamber through support pads as shown in FIG. 16. Specifically a first bottom pad 240 is mounted directly to the bottom of the wall of the chamber, such as the chamber 12. An upper support pad 242 has mounted on it the support arms, such as the support arms 236. Adjustable screw members 242 interconnect the pads 240 and 242 and allow for adjustment between the pads so as to compensate for manufacturing tolerances and provide for a smooth and level transport of the carrier assembly.

The various guides and bearing surfaces of the carrier block 224 ride on complementary rollers and circular roller guides mounted to the pairs of support arms 234, 236 and 238. Specifically as shown in FIG. 18, upper and lower circular roller guides 244 and 246 receive the elongated tapered guides 226 and 228. Support rollers 248 and 250 press against bearing surfaces 230 and 232. In this way the guide block is fully supported and guided for transport between chambers. The central pairs of support arms 236 only include the lower guide 246 and lower roller 250, but the weight of the upper structure plus the support by the guides and rollers of the end support arms 234 and 238 are sufficient even when the carrier moves out of engagement with one of the end pair of support arms for transport to an adjacent chamber. The carrier is actually passed onto the guides and rollers in the adjacent chamber as shown in FIGS. 3a through 3d.

In order to move the carrier arms 136 up and down to engage or disengage the carrier arms from the hub of the pallet 120, the carrier assembly includes an actuator structure. A first portion of the actuator structure is located within the guide block 224 and a second portion of the actuator structure is located below the bottom wall of the chamber. The second portion extends within the chamber at the home position for the carrier assembly so as to actuate the actuator structure within the carrier guide block 224. FIGS. 17, 20 and 21 illustrate this carrier arm actuator portion of the system in detail.

As shown in FIG. 21, guides 250 pass through openings in the carrier guide body 224 and specifically pass through bearing surfaces 252. The use of the spaced pair of guides 250 in the bearing structures 252 insures that the entire carrier arm structure 136 is raised and lowered in a smooth fashion without any twisting or bending.

The actual raising of the carrier arm structure 136 is provided by a center slide member 254 shown in detail in FIG. 17. The center slide 254 also passes through a bearing structure 256 located in a opening in the carrier body 224. A spring member 258 is captured between an end flange 260 and an end wall portion 262 of the carrier body 224. The spring 258 tends to push the center slide 254 in a downward direction so that the carrier arms 136 are normally biased in the downward direction. The center slide member 254 and thereby the entire carrier arm structure may be actuated in an upward direction using an actuator shown in FIG. 20 and illustrated in contact with the center slide 254 in FIG. 15.

The actuator includes an air chamber 264 for driving a piston 266 between a lower and upper position as shown by the full line and dotted line positions in FIG. 20. The actuator structure is mounted to extend through the bottom wall of the chamber, such as the chamber 12, and with a bellows 268 insuring for pressure seal integrity through the bottom wall of the chamber. Couplers 270 provide for coupling of air to and from the air chamber to actuate the piston 266. At the lower end of the piston 266, a stop adjustment 272 is provided and includes limit switches 274 and 276, used to sense the position of the piston. The limit switches 274 and 276 thereby control the actuation of the piston by controlling the application of air to the air chamber.

The pallets 120 are normally moved between chambers with the pallet arms 136 in the downward position. However, when the pallets are properly positioned in a chamber, the carrier assembly is in a home position so that the piston actuator 266 is located below the central slide 254. The air chamber 264 may be actuated to drive the piston 266 upward to thereby move the carrier arms 136 and pallets in an upward direction. This upward movement of the pallets is provided when it is desired to have a pallet received by a spindle assembly for rotation within a chamber. Once the pallet has been received by the spindle assembly, then the carrier arms 136 may be lowered to allow free rotation of the pallet without interference by the carrier arms.

The carrier arms 136 would also be actuated upward to retrieve a pallet after rotation so that the spindle assembly may be retracted and the pallet moved to the next process chamber. For example, as shown in FIG. 3a the carrier arms 136 through 144 are in the up position to retrieve the pallet for transport to the next chamber. Once the spindle assembly is free, the carrier arms may be moved downward, the pallets transported to the next chamber, the carrier arms moved upward, the spindle assemblies engaged and then the carrier arms moved downward as shown in FIG. 3b. The carrier assembly may then be moved back to the right, the various slit valves closed and the spindle assemblies may rotate the pallets for processing.

The actual transport of the individual carrier assemblies between chambers is accomplished through the use of a rack and pinion structure as shown in FIGS. 18, 19 and 21. Specifically a rack 280 is mounted along the carrier body 224 and extends along the complete length of the carrier body 224. The rack 280 is engaged by a pinion gear 282 and the pinion gear is driven by a drive gear 284 which is located at the end of a drive shaft 286. The drive shaft 286 is coupled through couplers 288 and 290 to the drive mechanism such as drive shaft 98 extending through the back wall of the chamber. Although this structure is described with reference to the load chamber, similar structure is provided for all of the process chambers, as shown in FIG. 2 and for the unload chamber.

In order to insure that the pinion gear 282 properly engages the rack as the rack is moved toward the pinion gear, the pinion gear is spring loaded on a mounting block to be floating, as shown in FIG. 19. Specifically a spring member 292 is coupled between a first mounting block 294 and a second mounting block 296. The pinion gear 282 passes through the block 296 and the block includes a bearing structure for allowing rotation of the pinion gear.

Assuming that a rack is passing from a first chamber to a second chamber and is approaching a pinion gear 282, the pinion gear is actually floating because of the spring 292 and the block 296 can thereby pivot around the shaft 286. This floating construction thereby forms a clutch so that if the position of the gear teeth on the pinion gear 282 are not such so as to perfectly engage the teeth on the rack 280, the pinion 282 is rotated upward out of position and slides until the teeth of the pinion 282 drop into place into the teeth of the rack. In this way, as the rack moves from pinion to pinion and becomes engaged by one pinion before being disengaged from the other, the floating pinion gear 282 can accommodate any misalignment or inaccuracies between the carrier drive assemblies in each chambers. This floating structure, therefore, allows for complete independence between chambers so that the chamber can be isolated by the slit valves and yet allow the carrier and specifically the rack to be transported between the chambers and be driven constantly sometimes by one, but sometimes by two pinion gears at the same time.

Figure 23:
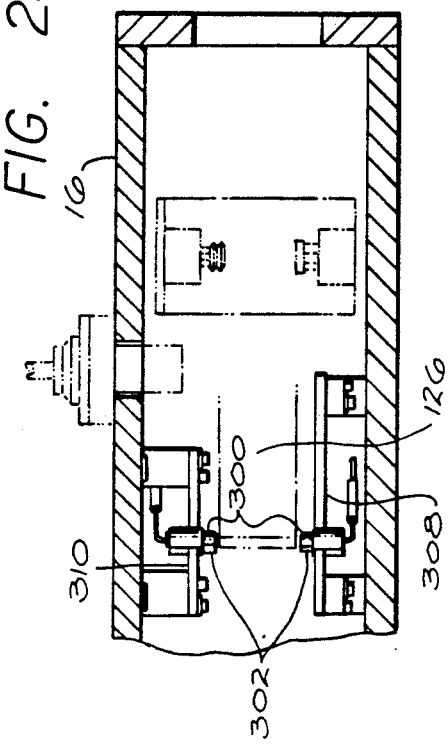
FIG. 23 is top view of the carrier means guide and support structure the showing optical limit detectors.
Figure 22:
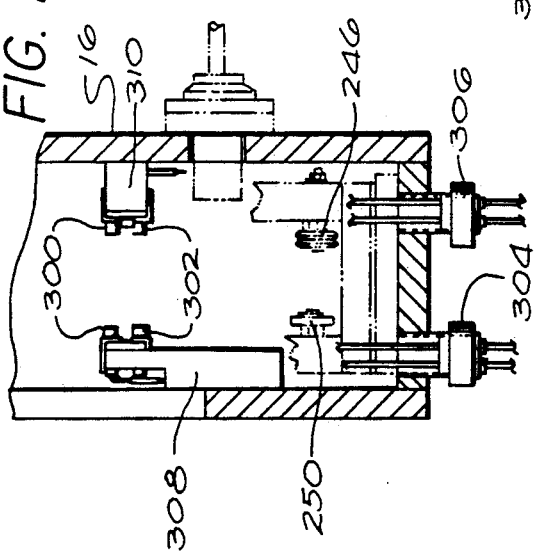
FIG. 22 is an end view of the carrier means guide and support structure illustrating the use of optical limit detectors.

The actual control of the stopping of the carrier in the proper position is provided by limit switches and specifically by fiber optic limit switches as shown in FIGS. 22 and 23. These switches ar shown mounted in a chamber such as process chamber 16, but is to be appreciated that similar switches would be located in all of the chambers. The fiber optic switches are shown to consist of two sets of fiber optic assemblies 300 and 302 forming light paths with one set located above the other and with one set staggered relative to the other in the direction of travel of the carrier such as the carrier 126. The feed through for the fiber optics is provided by feed through couplers 304 and 306 and with each coupler accommodating either a pair of input or a pair of output fiber optics.

The actual fiber optics are mounted on opposite sides or the chamber 12 using mounting structures 308 and 310. As the carrier, such as the carrier 126, is moved to a desired position, light is transmitted in the light path across the chamber by the sets of fiber optics 300 and 302. As the end of the carrier 126 initially interrupts the passage of light by the set of fiber optics 300, this initiates a signal to immediately slow up the carrier 126. When the end of the carrier now interrupts the passage of light by the set of fiber optics 302, this initiates a second signal which is used to stop the carrier very quickly. The use of the staggered sets of fiber optics 300 and 302 insures that the carrier will stop in an accurate position since the inertia of the carrier has first been slowed by the signal produced of the first set of fiber optics and then stopped by the signal produced by the second set of fiber optics.

Figure 24:
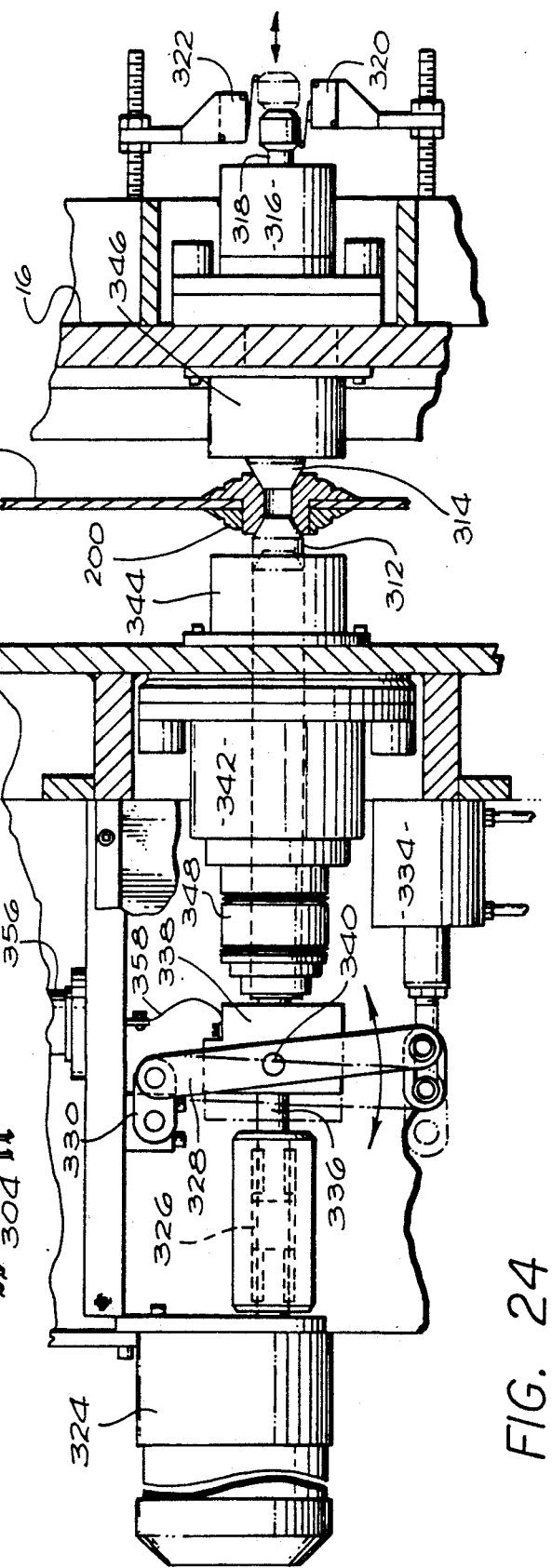
FIG. 24 is a detail view of a spindle assembly for engaging and rotating the pallet in a process chamber.

Once the carrier has been stopped in the desired position within a chamber, then the actuator, such as the piston 266 shown in FIG. 20, may be used to push the appropriate carrier arm exemplified by carrier arm 136 upward so that the hub of the pallet may now ba in position to be engaged by the spindle assembly shown in FIG. 24. Again using the chamber 16 as illustrative, the pallet 120 is shown located in position between the front and back walls of the chamber and with the hub 200 of the pallet being engaged by spindles 312 and 314. The spindle 314 is free to rotate and is moved in and out of engagement by a back spindle actuator structure. The spindle 312 is driven to rotate the entire pallet by a motor drive. In addition the spindle is also moved in and out of engagement by a front spindle actuator structure.

The back spindle actuator includes an air cylinder 316 mounted on the back wall of the chamber, and with a piston 318 passing through the cylinder 316 and including the spindle 314 mounted inside the chamber at the end of the piston 318. The in and out positions for the spindle 314 are controlled by a pair of adjustable limit switches 320 and 322. As indicated above, the spindle 314 is merely free to rotate and does not provide any motive force for the rotation of the pallet and may be considered the equivalent of the tail stock of a lathe.

This spindle 312, however, is driven to provide for the rotation of the pallet 120 and with the rotation produced by a spindle motor 324. The motor 324 drives the spindle through a coupler 326 so as to additionally allow for in and out movement for the spindle 312. The actual in and out movement of the spindle 312 is provided by a pivot link 328 which is mounted for pivoting at one end by a mounting block 330. The other end of the pivot link 328 is mounted to a piston shaft 332 controlled by an air cylinder 334. The air cylinder thereby drives the piston shaft 332 back and forth as shown in the dotted and full line positions in FIG. 24. The back and forth movement in turn moves the pivot link 328 back and forth, again as shown by the dotted and full line position.

Extending from the coupler 326 is a shaft member 336 which is actually the other end of the spindle 312. Surrounding the shaft 336 is a block 338 which allows for rotary movement of the shaft 336 and yet can control the in and out position of the shaft 336 and thereby the spindle 312. The pivot link 328 is coupled to the block 338 at pivot point 340. The movement of the pivot link 328 by the air cylinder 334 thereby controls the in and out position of the spindle 312.

The spindle structure also includes a rotary seal, such as seal 342, plus a bellows 348 and a bellows (not shown), to insure the proper in and out movement of the spindles 312 and 314 plus the rotation of the spindle 312 while still providing for a proper seal of the chamber 16. Depositions shield 344 and 346 protect the spindles 312 and 314. The spindle assembly, shown in FIG. 24, thereby allows for the rotation of the pallet 120 in a process chamber such as chamber 16.

Figure 25:
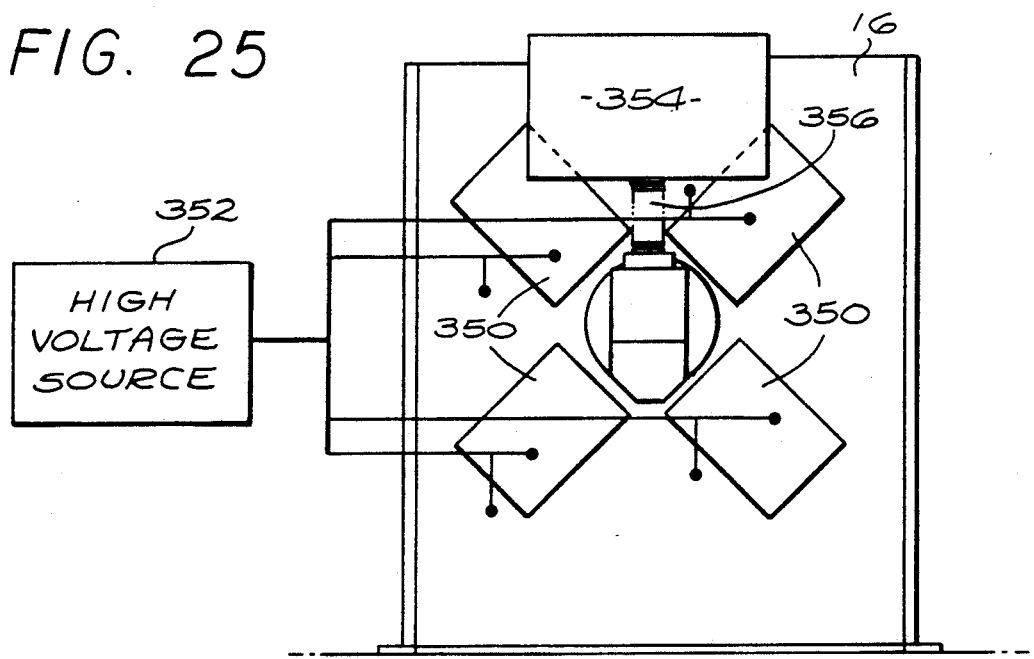
FIG. 25 is a front view of a process chamber illustrating the supply of high voltage to sputter plates.
Figure 26:
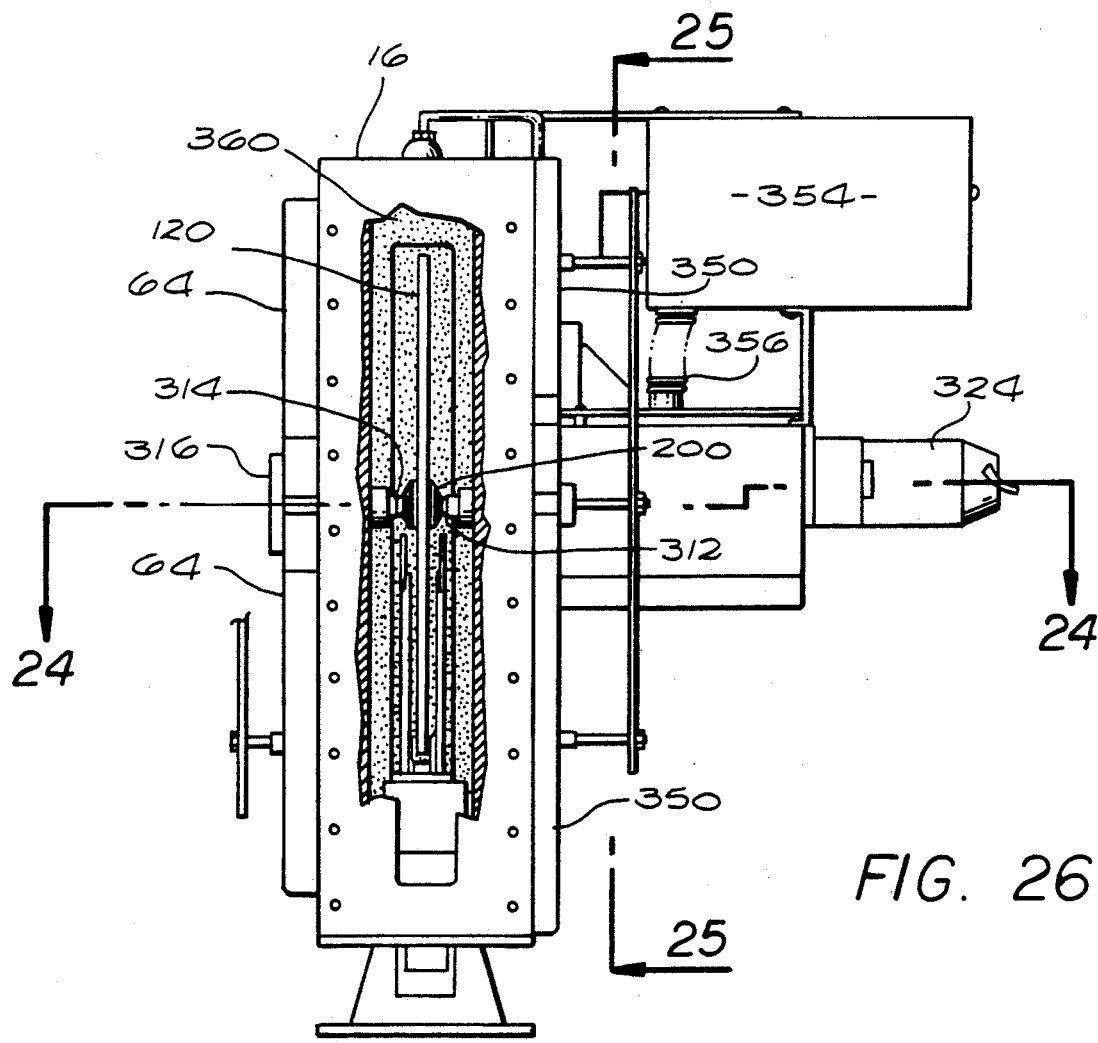
FIG. 26 is a side view of a process chamber partially broken away illustrating sputter deposition within the chamber.

FIG. 25 and 26 illustrate in general a process chamber, such as process chamber 16, and illustrating the actual processing of a particular pallet 120 by sputter deposition of material onto the individual substrates supported by the pallet. FIG. 25 illustrates the rear view of the chamber and shows that the chamber includes cathodes on the rear surface as well and the front surface. For example, in FIG. 1, cathodes 64 were shown to be located on the front door and FIG. 25 illustrates cathodes 350 located on the rear wall. A high voltage source 352 is shown to supply high voltage to all of the cathodes but it is to be appreciated that a separate high voltage source may be used for each of the cathodes 350. This would be true also for the front cathodes 64.

Mounted at the rear of the process chamber 16 is an RF matching network 354 shown in FIGS. 25 and 26. This matching network 354 may be used to supply through a coaxial cable 356, an RF signal to the spindle and thereby to the pallet 120. In order to insure that the RF signal is properly coupled to the spindle, the spindle assembly may include electrical isolation from the remaining portions of the cabinet. For example, the coupler 326 shown in FIG. 24 may also provide for electrical insulation. In addition, the rotary seal 346 may also include electrical isolation so that any RF signal passed through the cable 356 may be also coupled through a strap 358, shown in FIG. 24, to the spindle assembly and thereby the pallet.

As can be seen in FIG. 26, the application of a high voltage source to the cathodes 350 at the back of the chamber and cathodes 64 at the front of the chamber provides for the sputtering of material within the interior of the chamber to be deposited on the substrates supported by the pallet 120. This sputtering is shown by particles 360 within the cabinet. The sputtering deposition can occur individually within each chamber since each chamber is isolated from the next during the processing.

Figure 27:
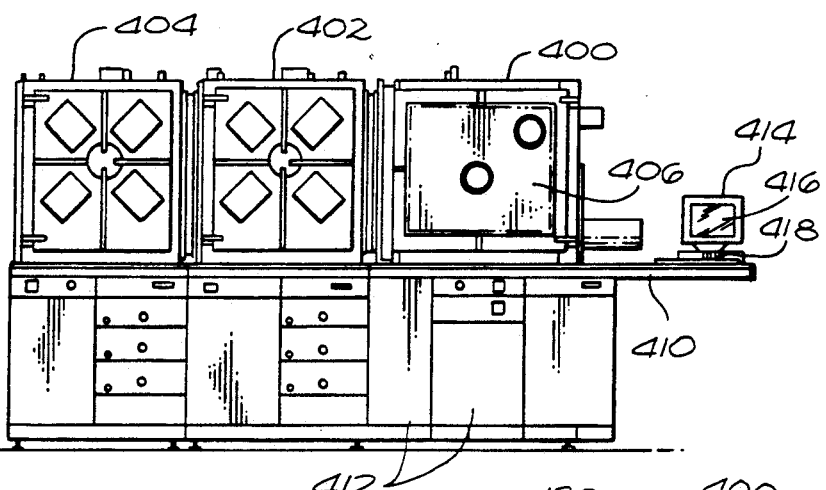
FIG. 27 is a second embodiment of the invention including a single load/unload chamber and two process chambers.

FIGS. 27 and 28a through 28d illustrate the use of a portion of the full system such as a half system for providing for the processing of a plurality or batch of pallets stored on a magazine. The structure shown in FIG. 27 would use the alternate load/unload door construction shown in FIG. 11. In FIG. 27 this half system is shown to include a load/unload chamber 400 and two process chambers 402 and 404. As shown in FIG. 11 the load/unload chamber 400 includes a door 406 which includes an enlarged portion 408 which forms a space large enough so as to allow for the storage of a complete magazine of pallets.

The magazine of pallets and the interior structure of the load/unload chamber 400 and the process chambers 402 and 404 would be substantially identical to that shown for the load chamber 12 and any of the process chambers 16 through 22. The system of FIG. 27 is also mounted onto a flat surface 410 supported by storage cabinets 412 and additionally including a control console 414 including a display 416 and a keyboard 418. The half system of FIG. 27 and FIGS. 28a through 28d is shown to have carriers equal to the number of chambers less one. This is similar to the full system described above. It is to be appreciated, however, if the system is only used to completely process a single pallet from the magazine and then return this pallet to the magazine before another pallet is removed, then it may be advantageous to use a single carrier to transport the pallet between all of the chambers. The following description, therefore, may be modified to include the use of a single carrier.

In general the operation of the system of FIG. 27 would be as follows. The load/unload chamber 400 includes a park enclosure 414. Initially a carrier 416 is parked in the park enclosure 414 to allow the magazine supporting the plurality or batch of pallets 120 to be inserted into the load chamber. This operation would be essentially the same as that shown in FIG. 10. Once the magazine has been loaded, the chambers would be closed and evacuated as described above. At this time the carrier 416 would be moved back into position and the magazine arms 122 would be rotated downward to allow the carrier arms of carrier 416 to support a first one of the pallets. The pallet may now be moved from chamber 400 to chamber 402 as shown by arrow 418.

Figure 28A:
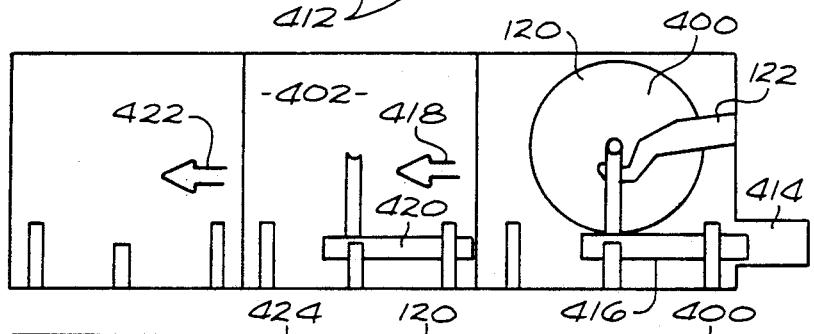
FIGS. 28a, 28b, 28c and 28d illustrate a sequence of steps showing a single pallet taken from a magazine through various process steps and representing the second embodiment of the invention.
Figure 28B:
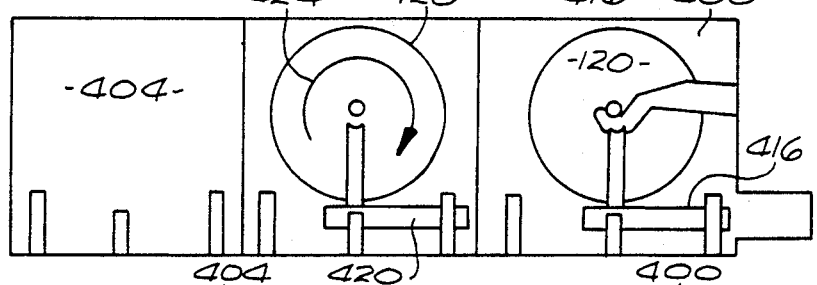

The chamber 402 also includes a carrier 420 and at this time carrier 420 is moved into the chamber 404 as shown by arrow 422. Before processing begins, the pallet in chamber 402 is engaged by a spindle assembly essentially similar to that described above and all of the carrier arms may now be dropped down since the pallet is being supported by the spindle assembly. The carriers 416 and 420 may be moved back into the original positions as shown in FIG. 28b. At this time the pallet in chamber 402 may be rotated as shown by arrow 424 and processing can occur.

Figure 28C:
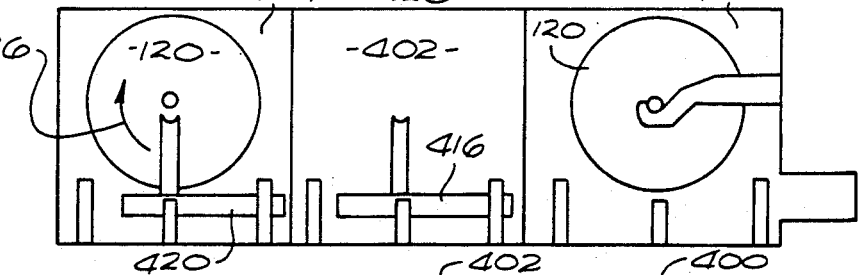
Figure 28D:
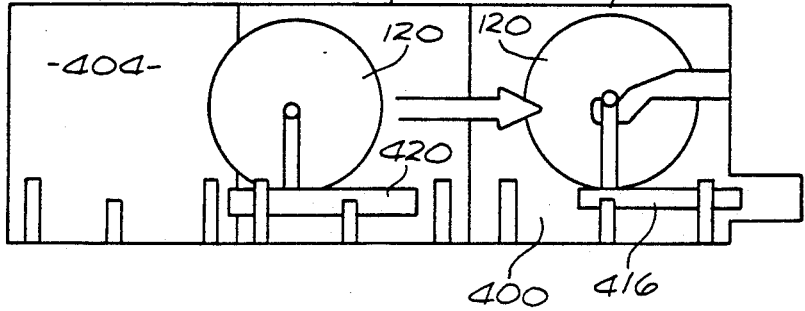

After the processing in chamber 402 is complete then the carrier arms may be moved up and specifically the carrier arms of carriage 420 now engages the pallet in chamber 402 and the spindle assembly may be disengaged. The carrier 420 may now carry the pallet from the chamber 402 to the chamber 404 as shown in FIG. 28c. At this point the spindle assembly in chamber 404 may engage the pallet and the carrier arms drop down and the pallet rotated, as shown by arrow 426, to provide for processing of the pallet.

The carriers 416 and 420 would be left in position since after processing the carrier 420 must take the pallet from chamber 404 to chamber 402. This is shown to be occurring in FIG. 28d. After the pallet is located in chamber 402 the spindle assembly may be engaged merely to hold the pallet in position so that the carrier assemblies may be moved back to the position shown in FIG. 28c so that the pallet in chamber 402 may now be picked up by the carrier 416 and moved back into its original position in load/unload chamber 400. At this time the processing of a first pallet is complete and the magazine may be indexed out of the chamber into the opening 408 in the door 406 to position the next pallet for processing following the steps and description outlined in FIG. 28a through 28d.

The above described alternate system only provides for a processing of a single pallet at a time, but still allows for the processing of a complete magazine or batch of pallets with only a single load and unload of the load/unload chamber. This will still greatly improve the efficiency of the inline vacuum processing system of the present invention when compared to prior art structures. Also depending upon the type of processing, it may be possible to move pallets into both of the process chambers, such as the process chamber 402 and 404 to have multiple processing occurring and provide for the appropriate stepping of the magazine to receive these processed pallets before having a second pair of pallets moved into the chambers 402 and 404. The present invention, therefore, has great flexibility depending upon the nature of the processing.

The present invention, therefore, is directed to an in line vacuum deposition system including a magazine and having a unique transport structure. The invention includes a load chamber having a support structure which receives the magazine. The magazine includes magazine arms formed in pairs which magazine supports a plurality or batch of pallets such as ten pallets. The entire magazine can be rolled into the load chamber support structure using a sliding track arrangement. The magazine support structure within the load chamber is attached to a ball screw so that each pallet in the magazine can be indexed to a transport position which is in alignment with a chamber carrier. In addition, an air cylinder is provided, with a bellows sealed feed through so as to rotate the magazine on the ball screw and provide for the rotation of the magazine arms through an angular arc, such as 15°, to thereby raise and lower the magazine arms.

A carrier is positioned within the load chamber and is designed to carry a single pallet in a pair of upstanding carrier arms and with this carrier capable of moving between the load chamber and a first process chamber. The carrier arms move between the magazine arms while the magazine arms are in their raised position. When the magazine arms are lowered, the carrier arms then support the pallet and the carrier can now move the pallet out of the load chamber into the first process chamber. The ball screw is then rotated so that the next pallet is indexed in alignment for pickup by the carrier arms. The magazine arms are then raised so that the carrier can now come back to pick up the second pallet.

Carriers are provided for every chamber except one. When the first carrier with its pallet reaches the center line of the first process chamber, the carrier arms and thereby the pallet is raised through the use of a bellows-sealed pneumatically-operated plunger which penetrates the bottom of the chamber. The carrier arms are raised to the center line of a spindle assembly so that a rear spindle and front spindle, which are in the form of cones, will penetrate the hub of the pallet and clamp the hub between the spindles. The carrier arms then drop back and the first carrier then moves back to the load chamber while a second carrier from the second process chamber moves into the first process chamber.

When both carriers reach their home or static position on the center line of the spindle, then the spindle in the first process chamber is rotated at a speed such as a speed between 0 to 60 RPM during which time sputtering or other processes take place. At the end of the process, the spindle stops turning, the carrier arms raise, again cradling the pallet, the spindles retract and the carrier arms are lowered to thereby carry the pallet. The first pallet is then moved to the second process chamber while the next pallet in the load chamber is moved to the first process chamber. The operations are repeated until all of the pallets have been transferred from the magazine in the load chamber through all of the process chambers to the magazine in the unload chamber.

The opposite operation takes place at the end of the system in the unload chamber where each pallet is lifted by the magazine arms off the carrier and stored in the magazine in the unload chamber. When the load chamber is out of pallets the door can be opened, the empty magazine removed and a fresh magazine of pallets inserted. This can be done in such a short period of time as to make the process nearly continuous. The same operation can take place in the unload chamber where the full magazine is unloaded and an empty magazine is put into the chamber to receive more pallets.

As described above, the system of the present invention can also function with a single load/unload chamber. In this "half" system it may be desirable to use only a single carrier instead of a carrier for each chamber but one. Alternately, additional carriers may be used as shown in FIG. 28a through 28d, if for example it is desired to move out two or more pallets for processing in two or more chambers. If a single pallet is used then in the structure shown in FIGS. 28a through 28d, the carrier 420 is eliminated and all of the transport operation is provided by carrier 416.

As with the complete system, the magazine load or batch of pallets is put into the load/unload chamber. The first pallet is then transferred for processing to the first process chamber and any additional process chambers and back to the load chamber where it is picked off the carrier, moved into a storage position and the next pallet loaded onto the carrier and processed. Finally, when all of the pallets are processed the load/unload chamber is opened and the full magazine with processed pallets removed and a new magazine with unprocessed pallets inserted for continuing the process.

Since the carrier may be parked in any of the chambers or in the park enclosure and since a single carrier can progress through all of the chambers, or multiple carriers representing the number of chambers unless one can be progressed back and forth, the system of the present invention has great flexibility in using either a single carrier or a plurality of carriers up to a number representing the number of chambers less one. In any event the system provides for a much greater efficiency in operation due to the processing of a complete magazine or batch of pallets rather than the processing of a single pallet as with prior art devices.

The following is a specific description of a specific embodiment of the system of the present invention and provides a multichamber inline side sputter deposition system for magnetic memory disc production. This system for magnetic memory disc production is designed to use substrate pallets which can hold up to 18 3½ diameter or 11 5¼ diameter discs. The total transfer time for transferring pallets between chambers, including pumpdown during transfer to high vacuum and gas backfill, is less than one half minute. Allowing for a process time of 2.5 minutes, this provides or an elapsed time between processes of a maximum of three minutes, or a rate of 20 pallets per hour. The system can thereby process substrates through the entire system with a total hourly rate exceeding 200 5¼ diameter discs. The load and unload chambers are designed to handle magazines of ten pallets each and the load or unload cycle time is less than four minutes. The load and unload operation is required twice per hour, but at different times and while the process is occurring so as to provide for a nearly continuous throughput during operation of the system.

The first process chamber is designed for sputter etching the substrates by use of a RF bias to the pallet. During the sputter etch process, the substrate pallet is rotated at a fixed rate of approximately 10 RPMs. The RF bias requires RF isolation of the pallet so as to provide for the transfer of the RF energy to the pallet through the spindle. The RF power that is supplied is 2000 watts at 13.6 MHz. The system includes an automatic RF matching network.

The second process chamber uses single target assemblies located on both the inside of the door and the back wall. The targets are designed to deposit an 800 angstrom layer of chrome. A sputter rate of approximately 8000 angstroms per minute can be achieved by using a 5 kilowatt DC power supply for the cathode and running this power supply at approximately 60% power. This generates an 800 angstrom film thickness on both sides of the substrate after approximately one minute of rotation of the pallet.

The third process chamber provides for a coating of 300 angstroms of an 80% colbalt 20% nickel material. The coating of this type of material requires a large amount of target material located on the inside of the front door and back wall and using a planar magnetron type cathode. This type of target material can be sputtered at a rate of approximately 100 angstroms per second and since the planar magnetron is only 10% effective due to the rotation of the substrates in front of the magnetron, 1.2 minutes of rotation will be necessary to coat all of the substrates to an 800 angstrom thickness.

Since this type of material requires a great amount of target material, four cathode assemblies are located on each side of the chamber and powered by 5000 watt DC power supplies. Individual pairs of targets, one on each side, are used for each process so that even though each target has a life of six hours, it will only be required that a target should be changed every 24 hours. Si a door is provided to each process chamber, a quick change of the targets can be accomplished.

A fourth chamber similar to the third chamber is used to provide for carbon coating. This chamber also includes the use of four planar magnetron cathode assemblies on each side of the chamber, but with these cathode assemblies operated simultaneously. This provides for a sputter rate of approximately 4 angstroms per second for the carbon. A rotation of approximately 2½ minutes will produce a film thickness for the carbon of 300 angstroms. Eight separate 5 kilowatts solid state DC power supplies are used for the planar magnetron cathodes. The amount of carbon which can be included on the targets is so great that it is not be necessary to change these targets except perhaps once a year.

The chambers are fabricated from plate stainless steel such as type 304 stainless steel. The thickness of the plate material is sufficient to minimize deflections which can create seal problems and changes in operating parameters. The chambers are heliarc welded with inside welds and all of the surfaces are electropolished to minimize outgasing from the surfaces. All of the instrumentation, valve control, etc. that are required to penetrate the chamber or which are attached to the chamber are flanged with either O-ring or Copper gasket seals.

The load and unload chambers, located at the ends of the system, have full opening doors and are approximately 20" deep by 36" square. The full opening doors are hinged and have two cam operated latches. The hinges are designed to provide an even pressure on O-ring seals and to produce a precise location of the doors with the seals as they close. The O-ring groove for the O-ring seals is a double dove-tail type which retains the O-rings so that they cannot fall out when a door is opened. The chambers are fitted with a large diameter pump port so that the load chamber may be pumped to a pressure of $1 \times 10^{-5}$ torr within three minutes and to maintain this pressure or less during any substrate heating.

Each process chamber is fabricated in the same way as the load and unload chambers, but are approximately 36" square $\times$ 6" deep. The process chambers are also fitted with large diameter pump ports to provide for a high vacuum within a relatively short period of time. Each process chamber includes a hinged and quick clamped door on one side of the chamber so as to allow for quick access to the interior of the chamber for removal of parts, cleaning, etc. Both the process chambers and load and unload chambers include viewing ports.

The pallets have a diameter of 26" and include a hardened stainless steel hollow hub designed to fit the magazine arms, the carrier arms and the spindles which provide for pallet rotation. The pallets are designed to hold individual substrates in internal grooves which grooves guide the substrates around their circumference to rotate the individual substrates as the pallet is rotated.

The system is equipped with a fully automatic process control system which may be operated either in an automatic process or manual process mode. The control system uses a programmable controller and a video data terminal including a display and keyboard. The central processing unit and core memory may be mounted in one or more of the control cabinets located below the mounting surface for the system. The status of the system may be graphically displayed on the display terminal and as an example, process parameters such as chamber pressures, temperatures, carrier positions and the status of the valves may be displayed and superimposed on a map of the system. Numerous types of programs may be provided depending upon the specific process requirement and the various conditions necessary for the processing of a particular type of substrate material.

As described above, and specifically to the described magnetic disc processing system, the specific system is designed to move a pallet containing 11 substrates from magazines holding 10 pallets inserted into the load chamber through multiple process chambers and into an unload chamber where the pallets are deposited into another 10 pallet magazine. Movement is from right to left. In order for the system to operate properly, there is one less pallet carrier then there are chambers in operation. The home position of each carrier is on the center line for each chamber. In the initial operation when the first process chamber is empty, and the carrier in the load chamber is located to the far right of the magazine in the park enclosure. A magazine is inserted into the load chamber and secured in position. The doors are closed and the sequence of operation is started. A roughing valve for the load chambers is opened and a heater control is energized.

The ball screw drives motor drive the magazine into the first transport position and the magazine actuator loads a pallet onto the carrier arms which has been returned from the park position in the park enclosure. The pallet is then heated to a temperature of 100° C. where it soaks for a period of three minutes. The pressure in the load chamber is monitored and when the pressure reaches a desired value, the roughing valve closes. At this time a high vacuum valve opens to a cyropump. At the same time the vacuum valve to the various process chambers are opened to cyropumps and any gas inlet valve closed. When all of the chambers reach the desired vacuum, all of the slit valves between the chambers are opened and the carriers move the pallets when available to the appropriate chambers. All of the pallet carriers move simultaneously back and forth after each process and with the operation continued until all of the pallets in the magazine in the load chamber are unloaded. At this time, the empty magazine is removed from the load chamber and a new magazine inserted and when all of the pallets have been loaded into the magazine in the unload chamber, the unload chamber is unloaded and a new empty magazine inserted.

The present invention, therefore, provides for an in line vacuum deposition system of increased efficiency and great flexibility when compared with prior art systems. Although the invention has been described with reference to particular embodiments, it is to be appreciated that various adaptations and modifications may be made and the invention is only to be limited by the appended claims.

I claim:

1. An inline processing system for a plurality of pallets each supporting a plurality of substrates for, including, a magazine for supporting the pallets in stacked relationship for processing, a load chamber disposed in adjacent relationship to the magazine for receiving and supporting the magazine and including indexing means coupled to the magazine structure for indexing the magazine to provide for the transfer of successive ones of the pallets in the stacked relationship from the magazine to the load chamber, a process chamber located inline with the load chamber and in adjacent relationship to the load chamber on the opposite side of the load chamber from the magazine and including a passageway between the load chamber and the process chamber to provide for the passage of individual ones of the pallets between the load chamber and the process chamber, valve means coupled to the passageway for opening and closing the passageway to provide for the passage of individual ones of the pallets between the load chamber and the process chamber when the passageway is open and for sealing the load chamber from the process chamber to prevent passage of pallets between the load chamber and the process chamber and to provide for independence in the atmospheres in the load and process chambers when the passageway is closed to facilitate the processing of the substrates in the process chamber, carrier means movable between the load and process chambers for receiving the individual ones of the pallets indexed from the magazine and for supporting the individual ones of the pallets for transport from the load chamber to the process chamber to a position for processing of the substrates in the process chamber, first drive and support means located within the load chamber for coupling to the carrier means to support the carrier means and for driving the carrier means from the load chamber to the process chamber to transfer each pallet from the load chamber to the process chamber for processing of the substrates on such pallet in the process chamber and for returning the carrier means from the process chamber to the load chamber after the transfer of such pallet from the load chamber to the process chamber, and second drive and support means located within the process chamber for coupling to the carrier means to support the carrier means and for driving the carrier means to the process chamber from the load chamber to transfer each pallet from the load chamber to the process chamber for processing of the substrate on such pallet in the process chamber and for returning the carrier means from the process chamber to the load chamber after the transfer of such pallet from the load chamber to the process chamber, and means for receiving the pallets after the substrates in the pallets have been processed in the process chamber.

2. The inline processing system of claim 1 wherein the magazine structure includes magazine arms for supporting individual ones of the pallets.

3. The inline processing system of claim 2 wherein each individual pallet includes a hub having stepped portions and with the magazine arms having end portions to engage the stepped portions of the hub and with each pallet supported by magazine arms located on each side of the pallet.

4. The inline processing system of claim 2 wherein
the magazine arms are movable between first and second positions to move the pallets between the first and second positions and wherein the carrier means are disposed to receive the individual ones of the pallets when the magazine arms are in the second position and the load chamber includes actuator means coupled to the magazine for providing a controlled movement of the magazine arms between the first and second positions.

5. The inline processing system of claim 1 wherein the carrier means includes carrier arms for supporting individual ones of the pallets and magazine arms and carrier arms are provided which are parallel to each other and wherein individual ones of the pallets are transferred from the magazine arms to the carrier arms when the magazine arms are in the second position and wherein the pallets are received from the carrier arms for retransfer to the magazine when the magazine arms are in the second position and wherein the magazine arms are disposed on opposite sides of the pallet and wherein each individual pallet includes a hub having first stepped portions located on opposite sides of the pallet to receive the magazine arms on the opposite sides of the pallet and having second stepped portions located on opposite sides of the pallet to receive the carrier arms on the opposite sides of the pallet.

6. The inline processing system of claim 1 wherein the indexing means includes a ballscrew actuator to index the magazine to positions providing for the transfer of successive ones of the pallets in the stacked relationship from the magazine to the load chamber and the load chamber includes a door having open and closed positions to provide for the loading of the pallets into the magazine and the unloading of the pallets from the magazine and the door includes an enlarged portion extending outwardly from the load chamber to form a space with the door in the closed position to receive at least a portion of the magazine as the magazine is indexed to present individual ones of the pallets to the position for transfer to the load chamber, the enlarged portion of the door forms a space large enough to receive both the magazine and individual ones of the pallets as the pallets are indexed from the magazine.

7. The inline processing system of claim 1 wherein the process chamber includes spindle means for engaging individual ones of the pallets transferred into the process chamber to provide a rotation of the individual ones of the pallets and the process chamber is provided with front and back portions and the spindle means is formed by separate front and back mechanisms mounted respectively on the front and back portions of the process chamber and wherein both mechanisms are movable toward the individual ones of the pallets in the process chamber to capture such individual pallets between the mechanisms for rotation and wherein each individual pallet includes a hub having a configuration to receive the front and back mechanisms of the spindle means to capture such pallet for rotation.

8. The inline processing system of claim 1 wherein the carrier means includes carrier arms for supporting individual ones of the pallets and wherein the individual ones of the pallets are transferred from the magazine to the carrier arms for transport of the pallets by the carrier means to the process chamber for processing of the substrates on the pallet and wherein each individual pallet includes a hub having stepped portions for receiving the carrier arms of the carrier means.

9. The inline processing system of claim 1 wherein the carrier means includes a rack member and each of the first and second drive and support means includes a pinion engageable to the rack to drive the carrier means between the chambers and wherein the pinions are mounted to float relative to the rack member for providing for a slidable movement between the rack and pinions and an independent drive of the carrier means by at least one of the pinions.

10. The inline processing system of claim 1 wherein the support means and carrier means include complementary bearing surfaces for guiding the movement of the carrier means between the load and process chambers.

11. The inline processing system of claim 1 wherein each individual one of the pallets includes a plurality of openings to receive the substrates on the pallets for processing and wherein each opening includes a groove having a width slightly larger than the thickness of the substrate and the substrates are seated within the grooves to hold the substrates for processing and wherein the substrates and the openings in the pallets are annular and the grooves extend around the annular openings in the pallets to receive the substrates.

12. The inline processing system of claim 1 wherein the load chamber is used for unloading pallets from the magazine and for loading pallets into the magazine for processing the pallets disposed in the magazine.

13. The inline processing system of claim 1 wherein the process chamber constitutes a first process chamber and wherein additional process chambers are disposed inline with the first process chamber and adjacent to the first process chamber and to one another and wherein each additional process chamber includes a passageway between itself and the adjacent process chamber and includes valve means coupled to the passageway to provide for the passage of individual ones of the pallets and provide for independence in the atmospheres in the chambers and wherein each additional process chamber, except for the last process chamber in the sequence, includes carrier means and wherein each process chamber includes drive and support means for coupling to the associated carrier means for transporting individual pallets to the adjacent chamber and wherein an individual one of the carrier means is provided to transport individual ones of the pallets between the associated chamber and the adjacent chamber next in the sequence and wherein a plurality of carrier means equal in number to the number of chambers less one are provided to transport individual ones of the pallets between successive pairs of the chambers.

14. The inline processing system of claim 13 wherein the magazine constitutes a first magazine and wherein an unload chamber is formed substantially as a mirror image of the load chamber for receiving and supporting a second magazine formed substantially as a mirror image of the first magazine and wherein the unload chamber is located inline at the end of the line of process chambers for a substantially continuous flow-through of pallets from the unprocessed state to the processed state and wherein each of the load and unload chambers includes a main portion and an inline extension from the main portion to park the carrier means outside of the main portion of the chamber so as not to obstruct the loading or unloading of the magazine.

15. The inline processing system of claim 1 wherein the load chamber includes a main portion and an inline extension to park the carrier means outside of the main portion of the chamber so as not to obstruct the loading of the magazine.

16. An inline system for processing a group of pallets each constructed to hold a plurality of substrates, including, a first magazine for supporting a particular number of unprocessed pallets, a load chamber disposed in cooperative relationship with the first magazine and including first means for indexing the magazine for presenting individual ones of the unprocessed pallets to a position for transfer from the magazine to the load chamber, a plurality of process chambers each disposed in an inline relationship with the load chamber and including a pair of valve means at opposite ends of such process chamber to control the passage of individual ones of the pallets between such process chamber and the next process chamber in the inline arrangement, each of the process chambers being constructed to process the substrates on the pallets in such chamber, a second magazine for supporting the pallets after processing the pallets in the process chambers, an unload chamber disposed in an inline relationship with the process chambers and disposed relative to the second magazine and including second means for indexing the magazine for receiving individual ones of the processed pallets from the process chamber furthest removed from the load chamber, the load chamber, the process chambers and the unload chamber being disposed in adjacent relationship with one another, a plurality of carrier means equal in number to the number of process chambers less one, each of the carrier means being disposed for movement between an adjacent pair of the process, load and unload chambers for receiving individual ones of the pallets from the first one of the chambers in the pair and for supporting the individual ones of the pallets at positions for transport by such carrier means to the second one of the chambers in the pair and for returning thereafter to the first chamber in the pair, and a plurality of drive and support means each normally located within an associated one of the chambers and associated with the carrier means in such chamber for coupling to the associated carrier means to support such associated carrier means and for driving such associated carrier means from such associated chamber to the next adjacent chamber in the pair and for returning the carrier means to such associated chamber in the pair.

17. The inline system of claim 16 wherein the magazines include magazine arms for supporting individual ones of the pallets and wherein each individual pallet includes a hub having stepped portions and wherein the magazine arms have end portions to engage the stepped portions of the hub and wherein the magazine arms are located on opposite sides of the associated pallet to support the associated pallet.

18. The inline system of claim 16 wherein the magazines include magazine arms for supporting individual ones of the pallets and wherein the magazine arms are movable between first and second positions to move the associated pallets between first and second positions and wherein the magazine arms support the pallets in the first position and individual ones of the pallets are transferred to the associated carrier means when the magazine arms are in the second position and wherein the load and unload chambers include actuator means coupled to the magazines for providing a controlled movement of the magazine arms between the first and second positions.

19. The inline system of claim 18 wherein each of the carrier means includes carrier arms for supporting individual ones of the pallets and the magazine arms and the carrier arms are parallel to each other and wherein individual ones of the pallets are transferred from the magazine arms to the carrier arms when the magazine arms are in the second position and are transferred to the magazines for disposition in the chambers when the magazine arms are in the first position and wherein each individual pallet includes a hub having first stepped portions located on opposite sides of the pallet to receive the magazine arms on opposite sides of the pallet and having second stepped portions located on opposite sides of the pallet to receive the carrier arms on opposite sides of the pallet.

20. The inline system of claim 16 wherein each of the first and second indexing means includes a ballscrew actuator to index the magazine to the position for transfer of individual ones of the pallets.

21. The inline system of claim 16 wherein each of the load and unload chambers includes a door having an open and closed positions to provide for the loading and unloading of the magazines and wherein each of the doors includes an enlarged portion extending outwardly to form a space with the door in the closed position for receiving at least a portion of the magazine as the magazine is indexed respectively to present or receive individual ones of the pallets in the transfer position.

22. The inline system of claim 16 wherein each process chamber includes a spindle mechanism to engage individual ones of the pallets in such process chamber for providing rotation of such pallets and wherein the spindle mechanism includes first and second mechanisms mounted respectively on opposite sides of the pallets and wherein the first and second mechanisms are movable toward individual ones of the pallets to capture the individual pallets between the first and second mechanisms for rotation and wherein each individual pallet includes a hub having a configuration to receive the first and second mechanisms of the spindle mechanism to capture the pallet for rotation by the spindle mechanism.

23. The inline system of claim 16 wherein each carrier means includes carrier arms for supporting individual ones of the pallets and wherein the individual ones of the pallets are respectively transferred from the magazine arms to the carrier arms for transport of the pallets by the carrier arms through the process chambers and wherein each individual pallet includes a hub having stepped portions for receiving the carrier arms.

24. The inline system of claim 16 wherein each carrier means includes a rack member and each associated drive and support means includes a pinion for engaging the rack member to drive the carrier means between the chambers in the pair associated with such carrier means and wherein each pinion is mounted to float relative to the associated rack member for a sliding movement between such rack member and such pinion until drive engagement occurs between such rack member and such pinion.

25. The inline system of claim 16 wherein the support means and the carrier means associated with each chamber includes complementary bearing surfaces for guiding such carrier means between the chambers in the pair.

26. The inline system of claim 16 wherein each of the pallets includes a plurality of openings to receive the substrates for processing and wherein each opening includes a groove having a depth slightly larger than the thickness of the substrate and wherein the substrates are seated within the grooves in the pallet for processing of the substrates.

27. The inline system of claim 16 wherein the unload chamber is formed substantially as a mirror image of the load chamber and the second magazine is formed substantially as a mirror image of the first magazine and wherein the loading into the load chamber of the pallets from the first magazine and the unloading of the pallets from the unload chamber into the second magazine provide for a substantially continuous flow of pallets through the chambers from an unprocessed state to a processed state and wherein each of the load and unload chambers includes a main portion and an inline extension for receiving the associated carrier means to park such carrier means in such inline extension outside of such main portion of such chamber to prevent obstruction of the respective loading or unloading of such magazine.

28. The inline system of claim 16 wherein each of the load and unload chambers includes an inline extension for receiving the associated carrier means to park such carrier means in such inline extension outside of such main portion of the chamber to prevent obstruction of the respective loading or unloading of such magazine.

29. An in-line system for processing a plurality of pallets each constructed to hold a plurality of substrates, including,
   a plurality of processing chambers disposed in an in-line arrangement, each of the processing chambers being constructed to process the substrates on the pallets in such chamber,
   an unloading chamber disposed in the in-line arrangement with the processing chambers, the unloading chamber being disposed at one end of the in-line arrangement,
   a magazine for holding the pallets in a stacked relationship, the magazine being disposed relative to the unloading chamber for providing for a sequential transfer of the pallets in the unloading chamber to the magazine in a stacked relationship,
   a plurality of carrier means each associated with an individual one of the processing chambers for providing for a sequential transfer of the pallets from such processing chamber to the next one of the chambers in the in-line arrangement and for returning to the associated chamber after such transfer,
   means at each of the processing chambers for processing the pallets in such chamber upon the transfer of such pallets from the previous chamber in the on-line arrangement, and a plurality of drive means each associated with an individual one of the processing chambers and the associated carrier means for such processing chamber for driving the associated carrier means between such associated processing chamber and the next chamber in the in-line arrangement.

30. An in-line system as set forth in claim 29 including, a plurality of means each disposed at an individual one of the processing chambers and responsive to each transfer of one of the pallets to such chamber by the carrier means for such processing chamber for rotating such pallet during the processing of the pallet in such chamber.

31. An inline system as set forth in claim 30, including, the carrier means for each processing station having first and second positions and operative in the first position to provide a transfer of each pallet from such processing chamber to the next chamber and to provide a return of the carrier means to such processing chamber and operative in the second position to provide for a rotation of the pallet by the rotating means associated with such chamber.

32. An in-line system as set forth in claim 29, including, means for loading successive pallets in each processing chamber in the in-line arrangement upon the processing of the pallets previously in such chamber and the transfer of such pallets from such chamber to the next chamber in the in-line arrangement.

33. An in-line system for processing a plurality of pallets each constructed to hold a plurality of substrates, including, a plurality of chambers, each constructed to process the substrates on the pallets, the chambers being disposed in an in-line arrangement, a plurality of carrier means each associated with an individual one of the chambers and movable to a next chamber in the in-line arrangement for transferring the pallets from such associated chamber to the next chamber, the carrier means having first and second positions and being operable in the second position to provide for the processing of the substrates on the pallet in a next chamber after the associated chamber and operable in the first position to provide for a movement of such pallet from the associated chamber to the next station for the processing of the substrates on such pallet in the next station and to provide for a return of such carrier means to such associated chamber from the next chamber after such transfer of such pallet to the next chamber, first magazine means, first means for sequentially transferring the pallets from the first magazine means into the first one of the chambers in the in-line arrangement for a transfer of the pallets to progressive ones of the chambers in the in-line arrangement after the processing of such pallets in stations in the in-line arrangement previous to such progressive chambers, second magazine means, and second means for sequentially transferring the pallets from the last chamber in the in-line arrangement to the second magazine means after the processing of the pallets in the chambers.

34. An in-line system as set forth in claim 33, including, control means for each chamber, the control means being operative to become coupled to the pallet in each such chamber with the carrier means in such station in the first position and to provide a rotation of the pallet in each such station upon the movement of the carrier means in such station to the second position, and a plurality of processing means each associated with an individual one of the chambers and operative to process the pallet in such chamber during the rotation of the pallet in such chamber by the control means.

35. An in-line system as set forth in claim 33, including, each of the first and second magazine means being constructed to store the pallets in a stacked relationship, the first means being constructed to provide an indexing movement to transfer successive ones of the pallets in the stacked relationship in the first magazine means to the first one of the chambers in the in-line arrangement, and the second means being constructed to provide an indexing movement to transfer successive ones of the pallets in the stacked relationship from the last one of the chambers in the in-line arrangement to the second magazine means.

36. An in-line system as set forth in claim 33, including, the first means including first magazine arms movable between first and second positions and operable in the first position to support the pallets in the first magazine means and operable in the second position to release the pallets in the first magazine means for movement from the first magazine means to the first chamber by the carrier means associated with the first chamber in the in-line arrangement, the second means including second magazine arms movable between first and second positions and operable in the first position to support the pallets in the second magazine means and operable in the second position to provide for the movement of the pallets from the last chamber in the inline arrangement to the second magazine means by the carrier means associated with the last chamber in the in-line arrangement.

37. An in-line system for processing a plurality of pallets each constructed to hold a plurality of substrates, including, a first magazine for holding the pallets in a stacked relationship, a load chamber disposed adjacent the first magazine, first means disposed in the first magazine and movable between first and second positions and operable in the first position to retain the pallets in the first magazine and operable in the second position to provide for the transfer of pallets from the first magazine into the load chamber, second means for indexing the first means to the positions in the first magazine for providing for the transfer of successive ones of the pallets from the first magazine into the load chamber, at least one processing chamber disposed adjacent the load chamber for processing the pallets transferred from the first magazine, first carrier means movable between the processing chamber and the load chamber for transferring the pallets from the load chamber to the processing chamber, means for processing the pallets transferred to the processing chamber, an unload chamber disposed adjacent the processing chamber, a second magazine disposed adjacent the unload chamber for holding the pallets in a stacked relationship, third means disposed in the second magazine and movable between first and second positions and operable in the first position to retain the pallets in the second magazine and operable in the second position to provide for a transfer of the pallets from the unload chamber into the second magazine, second carrier means movable between the processing chamber and the unload chamber for transferring the pallets from the processing chamber into the unload chamber, and fourth means for indexing the third means to the positions in the second magazine to provide for the transfer of successive ones of the pallets from the unload chamber into the second magazine.

38. An in-line system as set forth in claim 37 wherein the first carrier means has first and second positions and is operable in the first position for transferring the pallets from the load chamber to the processing chamber and is operable in the second position for providing for a substantially uniform processing of the pallets in the processing chamber and wherein the second carrier means has first and second positions and is operable in the first position to provide for a transfer of the pallets from the processing chamber into the unload chamber and is operable in the second position for releasing the pallets in the processing chamber from the substantially uniform processing in the processing chamber.

39. An in-line system as set forth in claim 37, including, means for rotating the pallets in the processing chamber to provide for the substantially uniform processing of the pallets, and means responsive to the disposition of the first carrier means in the second position for coupling the rotating means to the pallet in the processing chamber to provide for the rotation of the pallet by the rotating means.

40. An in-line system as set forth in claim 39 wherein the first carrier means is movable in a first position from the load chamber to the processing chamber to transfer one of the pallets from the load chamber to the processing chamber for processing, is thereafter movable to the second position to provide for the coupling of the rotating means to such pallet, is subsequently movable to the first position and is then movable to the load chamber with the first carrier means in the first position and wherein the second carrier means is movable in a first position from the processing chamber to the unload chamber to transfer the processed pallet in the processing chamber to the unload chamber and is thereafter movable in the first position to the processing chamber.

* * * * *